US012426444B2

(12) United States Patent
Yan et al.

(10) Patent No.: US 12,426,444 B2
(45) Date of Patent: Sep. 23, 2025

(54) DISPLAY DEVICE, DISPLAY PANEL AND MANUFACTURING METHOD THEREOF, DRIVING CIRCUIT AND DRIVING METHOD

(71) Applicant: BOE Technology Group Co., Ltd., Beijing (CN)

(72) Inventors: Huajie Yan, Beijing (CN); Haibin Zhu, Beijing (CN); Xiaohu Li, Beijing (CN); Zhiqiang Jiao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 632 days.

(21) Appl. No.: 17/630,906

(22) PCT Filed: Mar. 24, 2021

(86) PCT No.: PCT/CN2021/082838
§ 371 (c)(1),
(2) Date: Jan. 27, 2022

(87) PCT Pub. No.: WO2022/160441
PCT Pub. Date: Aug. 4, 2022

(65) Prior Publication Data
US 2023/0165094 A1    May 25, 2023

(30) Foreign Application Priority Data

Jan. 26, 2021  (CN) .......................... 202110101413.9

(51) Int. Cl.
*H10K 59/121* (2023.01)
*H10K 59/12* (2023.01)
(Continued)

(52) U.S. Cl.
CPC ..... *H10K 59/1213* (2023.02); *H10K 59/1201* (2023.02); *H10K 59/122* (2023.02);
(Continued)

(58) Field of Classification Search
CPC ............ H10K 59/1213; H10K 59/353; H10K 59/1201; H10K 59/122; H10K 59/32
See application file for complete search history.

(56) References Cited

U.S. PATENT DOCUMENTS 5,703,436 A    12/1997  Forrest et al.
6,264,805 B1    7/2001  Forrest et al.
(Continued)

FOREIGN PATENT DOCUMENTS

| CN | 1215500 A | 4/1999 |
| CN | 1665360 A | 9/2005 |

(Continued)

OTHER PUBLICATIONS

Written Opinion of International Application No. PCT/CN2021/082837 dated Nov. 4, 2021, (4p).

(Continued)

*Primary Examiner* — Christine A Enad
(74) *Attorney, Agent, or Firm* — Arch & Lake LLP

(57) ABSTRACT

The present disclosure relates to a display device, a display panel and a driving circuit, and a driving method. The display panel includes a driving backplane and a light emitting device layer, and the driving backplane includes multiple pixel driving circuits, the light emitting device layer includes multiple light emitting units distributed in an array, the light emitting unit includes multiple light emitting devices stacked in a direction away from the driving backplane, and light emitting devices other than a light emitting device closest to the driving backplane in a direction perpendicular to the driving backplane are transparent devices; and in the same light emitting unit, at least part of the light emitting devices are coupled to the pixel driving circuits for emitting light under driving of the pixel driving circuits, and (Continued)

at least two light emitting devices in the same light emitting unit have different light emitting materials.

18 Claims, 22 Drawing Sheets

(51) Int. Cl.
  *H10K 59/122* (2023.01)
  *H10K 59/18* (2023.01)
  *H10K 59/32* (2023.01)
  *H10K 59/35* (2023.01)
  *H10K 59/80* (2023.01)
  *H10K 71/00* (2023.01)

(52) U.S. Cl.
  CPC ............ *H10K 59/18* (2023.02); *H10K 59/32* (2023.02); *H10K 59/353* (2023.02); *H10K 59/8792* (2023.02); *H10K 71/00* (2023.02)

(56) References Cited

U.S. PATENT DOCUMENTS

| | | | |
|---|---|---|---|
| 6,596,134 | B2 | 7/2003 | Forrest et al. |
| 7,173,369 | B2 | 2/2007 | Forrest et al. |
| 7,714,504 | B2 | 5/2010 | Forrest et al. |
| 8,324,803 | B2 | 12/2012 | Forrest et al. |
| 8,680,693 | B2 | 3/2014 | Kang et al. |
| 9,082,735 | B1 | 7/2015 | Sundararajan |
| 9,570,532 | B2 | 2/2017 | Huangfu et al. |
| 9,761,166 | B2 | 9/2017 | Gu et al. |
| 9,865,668 | B2 | 1/2018 | Sato |
| 10,147,361 | B2 | 12/2018 | Gu et al. |
| 10,157,573 | B2 | 12/2018 | Pappas et al. |
| 10,193,104 | B2 | 1/2019 | Xu et al. |
| 10,396,135 | B2 | 8/2019 | Hsu |
| 10,566,404 | B2 | 2/2020 | Sato |
| 10,651,259 | B2 | 5/2020 | Sato |
| 10,673,005 | B2 | 6/2020 | Park et al. |
| 10,916,192 | B2 | 2/2021 | Pappas et al. |
| 2002/0153243 | A1 | 10/2002 | Forrest et al. |
| 2003/0213967 | A1 | 11/2003 | Forrest et al. |
| 2004/0263499 | A1 | 12/2004 | Tanada et al. |
| 2007/0132369 | A1 | 6/2007 | Forrest et al. |
| 2009/0009101 | A1 | 1/2009 | Kang et al. |
| 2010/0187988 | A1 | 7/2010 | Forrest et al. |
| 2014/0167011 | A1 | 6/2014 | Huangfu et al. |
| 2015/0255012 | A1 | 9/2015 | Gu et al. |
| 2016/0315133 | A1 | 10/2016 | Sato |
| 2017/0294624 | A1 | 10/2017 | Xu et al. |
| 2017/0309224 | A1 | 10/2017 | Pappas et al. |
| 2017/0330517 | A1 | 11/2017 | Gu et al. |
| 2018/0090551 | A1 | 3/2018 | Sato |
| 2018/0331164 | A1 | 11/2018 | Hsu |
| 2019/0027094 | A1 | 1/2019 | Pappas et al. |
| 2019/0157369 | A1 | 5/2019 | Sato |
| 2019/0198788 | A1 | 6/2019 | Park et al. |
| 2019/0259132 | A1* | 8/2019 | Miyasaka ............ H10K 59/131 |
| 2020/0212119 | A1 | 7/2020 | Shim et al. |
| 2020/0235184 | A1 | 7/2020 | Sato |
| 2021/0134220 | A1 | 5/2021 | Pappas et al. |
| 2022/0158059 | A1* | 5/2022 | Jin ............................ H01L 33/42 |
| 2022/0209157 | A1 | 6/2022 | Lee et al. |

FOREIGN PATENT DOCUMENTS

| | | |
|---|---|---|
| CN | 101127194 A | 2/2008 |
| CN | 101371619 A | 2/2009 |
| CN | 102034934 A | 4/2011 |
| CN | 101127194 B | 5/2011 |
| CN | 103021334 A | 4/2013 |
| CN | 104716264 A | 6/2015 |
| CN | 104813488 A | 7/2015 |
| CN | 105493307 A | 4/2016 |
| CN | 106067473 A | 11/2016 |
| CN | 104716264 B | 2/2017 |
| CN | 107946343 A | 4/2018 |
| CN | 109257943 A | 1/2019 |
| CN | 109416900 A | 3/2019 |
| CN | 110428778 A | 11/2019 |
| CN | 111370448 A | 7/2020 |
| EP | 0885451 B1 | 2/1997 |
| EP | 0885451 A1 | 9/1997 |
| EP | 1974590 A1 | 10/2008 |
| EP | 1974590 B1 | 10/2008 |
| EP | 2743909 A1 | 6/2014 |
| EP | 2743909 B1 | 5/2018 |
| EP | 3357056 A2 | 8/2018 |
| EP | 3437146 A1 | 2/2019 |
| EP | 3675175 A1 | 7/2020 |
| GB | 2549734 A | 11/2017 |
| GB | 2549734 B | 11/2017 |
| JP | 2006302506 A | 11/2006 |
| KR | 20090039139 A | 4/2009 |
| KR | 100941591 B1 | 2/2010 |
| KR | 20140140861 A | 12/2014 |
| KR | 20180078641 A | 7/2018 |
| WO | 9733296 A1 | 9/1997 |
| WO | 2007083918 A1 | 7/2007 |
| WO | 2014106335 A1 | 7/2014 |
| WO | 2016025824 A1 | 2/2016 |
| WO | 2017070892 A1 | 5/2017 |
| WO | 2017189578 A2 | 11/2017 |
| WO | 2017189578 A3 | 11/2017 |
| WO | 2018205734 A1 | 11/2018 |
| WO | 2021027514 A1 | 2/2021 |

OTHER PUBLICATIONS

Written Opinion of International Application No. PCT/CN2021/082838 dated Oct. 18, 2021, (4p).

First Office Action issued in Chinese Application No. 202110101413.9 dated Apr. 2, 2022 with English translation, (16p).

CTNF of U.S. Appl. No. 17/629,739, issued on May 7, 2025, (37p).

* cited by examiner

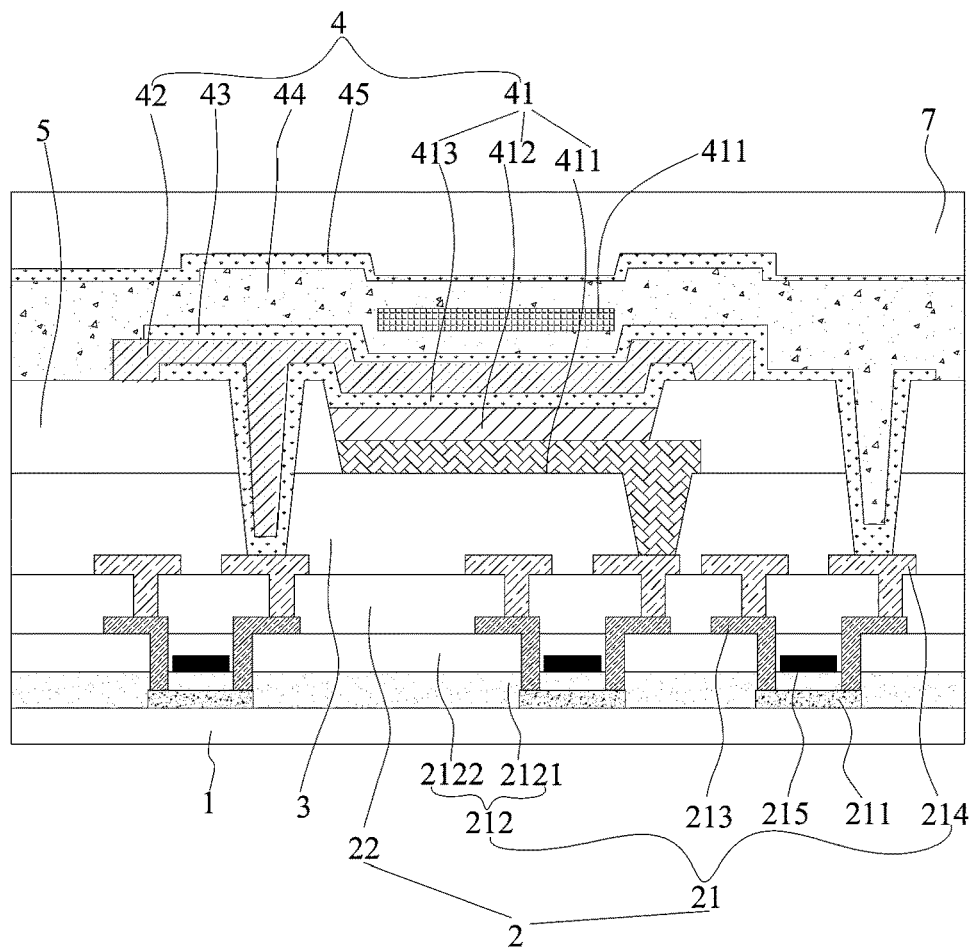

FIG. 29

| a driving backplane, including multiple pixel driving circuits | S110 |

| a light emitting device layer, including multiple light emitting units distributed in an array, wherein the light emitting unit includes multiple light emitting devices stacked in a direction away from the driving backplane; light emitting devices other than the light emitting device closest to the driving backplane in a direction perpendicular to the driving backplane are transparent devices; and in the same light emitting unit, at least part of the light emitting devices are coupled to the pixel driving circuits for emitting light under driving of the pixel driving circuits, and at least two light emitting devices in the same light emitting unit have different light emitting materials | S120 |

FIG. 30

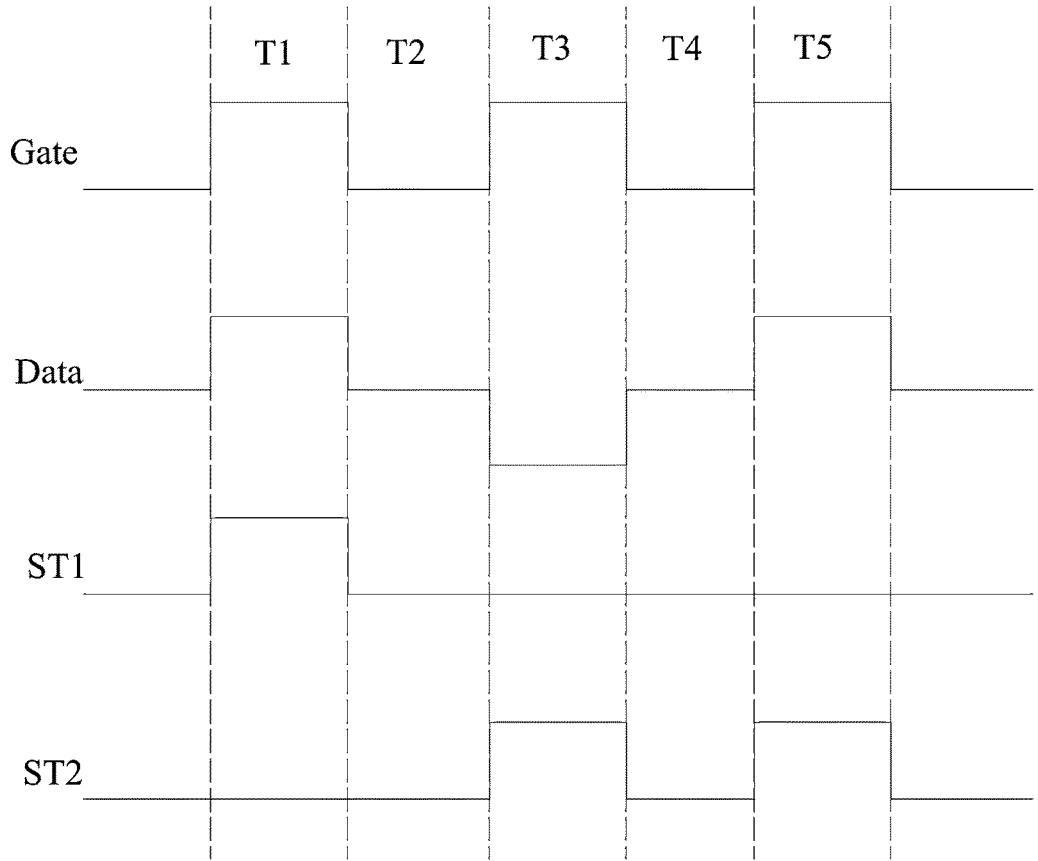

FIG. 42

| in a data writing stage, turning on a data writing unit to transmit a data signal to a control terminal of a driving transistor through the data writing unit and the driving transistor, and to charge an energy storage unit | S310 |

| in a light emitting stage, inputting a first power signal to the driving transistor through the energy storage unit to turn on the driving transistor, so that a signal of the second terminal of the driving transistor is transmitted to the first terminal of the first light emitting device; turning off the first switching unit and the second switching unit, and turning on the third switching unit and the fourth switching unit to make the first light emitting device emit light; or turning on the first switching unit and the fourth switching unit, and turning off the second switching unit and the third switching unit to make the second light emitting device emit light; or, turning on the first switching unit and the second switching unit, and turning off the third switching unit and the fourth switching unit to make the third light emitting device emit light | S320 |

FIG. 43

DISPLAY DEVICE, DISPLAY PANEL AND MANUFACTURING METHOD THEREOF, DRIVING CIRCUIT AND DRIVING METHOD

CROSS-REFERENCE

This application is the 371 application of PCT Application No. PCT/CN2021/082838, filed on Mar. 24, 2021, which is based upon and claims the priority to the Chinese Patent Application NO. 202110101413.9, entitled "DISPLAY DEVICE, DISPLAY PANEL AND MANUFACTURING METHOD THEREOF", filed on Jan. 26, 2021, the entire contents of which are hereby incorporated by reference.

TECHNICAL FIELD

The present disclosure relates to the field of display technologies, and in particular, to a display device, a display panel and a manufacturing method thereof, a driving circuit and a driving method.

BACKGROUND

With the development of display technologies, organic light emitting diode (OLED) display panels are widely used in the display technologies due to their advantages of lightness, thinness, high contrast, flexibility, short response time, etc.

It should be noted that the information disclosed in the Background section above is only for enhancing the understanding of the background of the present disclosure, and thus may include information that does not constitute prior art known to those of ordinary skill in the art.

SUMMARY

An objective of the present disclosure is to provide a display device, a display panel and a manufacturing method thereof, a driving circuit and a driving method.

According to an aspect of the present disclosure, there is provided a display panel including:
  a driving backplane, including multiple pixel driving circuits; and
  a light emitting device layer, including multiple light emitting units distributed in an array, wherein the light emitting unit includes multiple light emitting devices stacked in a direction away from the driving backplane, and light emitting devices other than a light emitting device closest to the driving backplane in a direction perpendicular to the driving backplane are transparent devices; and
  in the same light emitting unit, at least part of the light emitting devices are coupled to the pixel driving circuits for emitting light under driving of the pixel driving circuits, and at least two light emitting devices in the same light emitting unit have different light emitting materials.

According to an aspect of the present disclosure, there is provided a display device including the display panel in any one of the embodiments described above.

According to an aspect of the present disclosure, there is provided a manufacturing method for a display panel, including:
  forming a driving backplane including multiple pixel driving circuits; and
  forming a light emitting device layer on a side of the driving backplane, wherein the light emitting device layer includes multiple light emitting units distributed in an array, wherein the light emitting unit includes multiple light emitting devices stacked in a direction away from the driving backplane, and light emitting devices other than the light emitting device closest to the driving backplane in a direction perpendicular to the driving backplane are transparent devices;
  wherein in the same light emitting unit, at least part of the light emitting devices are coupled to the pixel driving circuits for emitting light under driving of the pixel driving circuits, and at least two light emitting devices in the same light emitting unit have different light emitting materials.

According to an aspect of the present disclosure, there is provided a pixel driving circuit configured to drive multiple light emitting devices connected in series between a first power terminal and a second power terminal to emit light;
  the pixel driving circuit includes multiple driving units, and each driving unit includes a driving transistor, a data writing unit and an energy storage unit;
  the driving transistor has a control terminal, a first terminal and a second terminal, and the second terminal of the driving transistor is configured to be coupled to a first terminal of the light emitting device;
  the data writing unit is configured to be turned on in response to a writing control signal to transmit the data signal to the control terminal of the driving transistor;
  a first terminal of the energy storage unit is coupled to the first power terminal, and a second terminal of the energy storage unit is coupled to the control terminal of the driving transistor;
  the first terminal of each light emitting device is coupled to a second terminal of a driving transistor of one of the driving units.

According to an aspect of the present disclosure, there is provided a pixel driving circuit, configured to drive a first light emitting device, a second light emitting device and a third light emitting device connected in series between a first power terminal and a second power terminal device to emit light, and the pixel driving circuit includes:
  a driving transistor having a control terminal, a first terminal and a second terminal, wherein the second terminal of the driving transistor is configured to be coupled to a first terminal of the first light emitting device;
  a data writing unit, configured to be turned on in response to a writing control signal to transmit a data signal to the control terminal of the driving transistor;
  an energy storage unit, wherein a first terminal of the energy storage unit is coupled to the first power terminal, and a second terminal of the energy storage unit is coupled to the control terminal of the driving transistor;
  a first switching unit, configured to be turned on in response to a light emitting control signal, wherein a first terminal of the first switching unit is coupled between the driving transistor and the first light emitting device, and a second terminal of the first switching unit is coupled between the first light emitting device and the second light emitting device;
  a second switching unit, configured to be turned on in response to the light emitting control signal, wherein a first terminal of the second switching unit is coupled between the driving transistor and the first light emitting device, and a second terminal of the second switching unit is coupled between the second light emitting device and the third light emitting device;

a third switching unit, configured to be turned on in response to the light emitting control signal, wherein a first terminal of the third switching unit is coupled between the first light emitting device and the second light emitting device, and a second terminal of the third switching unit is coupled to the second power terminal; and a fourth switching unit, configured to be turned on in response to the light emitting control signal, wherein a first terminal of the fourth switching unit is coupled between the second light emitting device and the third light emitting device, and a second terminal of the fourth switching unit is coupled to the second power terminal.

According to an aspect of the present disclosure, there is provided a pixel driving circuit, configured to drive a first light emitting device, a second light emitting device and a third light emitting device connected in series between a first power terminal and a second power terminal device to emit light, and the pixel driving circuit includes:

a driving transistor having a control terminal, a first terminal and a second terminal, wherein the second terminal of the driving transistor is configured to be coupled to a first terminal of the first light emitting device;

a data writing unit, configured to be turned on in response to a writing control signal to transmit a data signal to the control terminal of the driving transistor;

an energy storage unit, wherein a first terminal of the energy storage unit is coupled to the first power terminal, and a second terminal of the energy storage unit is coupled to the control terminal of the driving transistor;

a first switching unit, configured to be turned on in response to a light emitting control signal, wherein a first terminal of the first switching unit is coupled between the driving transistor and the first light emitting device, and a second terminal of the first switching unit is coupled between the first light emitting device and the second light emitting device;

a second switching unit, configured to be turned on in response to the light emitting control signal, wherein a first terminal of the second switching unit is coupled between the first light emitting device and the second light emitting device, and a second terminal of the second switching unit is coupled between the second light emitting device and the third light emitting device; and a third switching unit, configured to be turned on in response to the light emitting control signal, wherein a first terminal of the third switching unit is coupled between the second light emitting device and the third light emitting device, and a second terminal of the third switching unit is coupled to the second power terminal.

According to an aspect of the present disclosure, there is provided a pixel driving circuit, configured to drive a first light emitting device, a second light emitting device and a third light emitting device connected in series between a first power terminal and a second power terminal device to emit light, and the pixel driving circuit includes:

a driving transistor having a control terminal, a first terminal and a second terminal, wherein the second terminal of the driving transistor is configured to be coupled to a first terminal of the first light emitting device;

a data writing unit, configured to be turned on in response to a writing control signal to transmit a data signal to the control terminal of the driving transistor; and an energy storage unit, wherein a first terminal of the energy storage unit is coupled to the first power terminal, and a second terminal of the energy storage unit is coupled to the control terminal of the driving transistor;

a first switching unit, configured to be turned on in response to a light emitting control signal, wherein the first switching unit is coupled between the second terminal of the driving transistor and the first light emitting device;

a second switching unit, configured to be turned on in response to the light emitting control signal, wherein a first terminal of the first switching unit is coupled between the driving transistor and the first light emitting device, and a second terminal of the first switching unit is coupled between the second light emitting device and the third light emitting device; and a connecting wire, wherein one end of the connecting wire is coupled between the first light emitting device and the second light emitting device, and the other end is coupled to the second power terminal.

According to an aspect of the present disclosure, there is provided a driving method for a pixel driving circuit, which is applied to the pixel driving circuit in any of the embodiments described above;

the driving method includes:

in a data writing stage, turning on the data writing unit of each driving unit to transmit the data signal to the control terminal of the driving transistor through the data writing unit and the driving transistor, and to charge the energy storage unit, so that the multiple light emitting devices emit light simultaneously.

According to an aspect of the present disclosure, there is provided a driving method for a pixel driving circuit, which is applied to the pixel driving circuit in any one of the embodiments described above;

the driving method includes:

in a data writing stage, turning on the data writing unit to transmit the data signal to the control terminal of the driving transistor through the data writing unit and the driving transistor, and to charge the energy storage unit; and in a light emitting stage, inputting a first power signal to the driving transistor through the energy storage unit to turn on the driving transistor, so that a signal of the second terminal of the driving transistor is transmitted to the first terminal of the first light emitting device; turning off the first switching unit and the second switching unit, and turning on the third switching unit and the fourth switching unit to make the first light emitting device emit light; or turning on the first switching unit and the fourth switching unit, and turning off the second switching unit and the third switching unit to make the second light emitting device emit light; or, turning on the first switching unit and the second switching unit, and turning off the third switching unit and the fourth switching unit to make the third light emitting device emit light.

According to an aspect of the present disclosure, there is provided a driving method for a pixel driving circuit, which is applied to the pixel driving circuit in any one of the embodiments described above;

the driving method includes:

in a data writing stage, turning on the data writing unit to transmit the data signal to the control terminal of the driving transistor through the data writing unit and the driving transistor, and to charge the energy storage unit; and in a light emitting stage, inputting a first power signal to the driving transistor through the energy storage unit to turn on the driving transistor, so that a signal of the second terminal of the driving transistor is transmitted to the first terminal of the first light emitting device; turning off the first switching unit, and turning on the second switching unit and the third switching unit to make the first light emitting device emit light; or turning off the second switching unit, and turning on the first switching unit and the third switching unit to make the second light emitting device emit light; or turning off the third switching unit, and turning on the first switching unit and the second switching unit to make the third light emitting device emit light.

According to an aspect of the present disclosure, there is provided a driving method for a pixel driving circuit, which is applied to the pixel driving circuit in any one of the embodiments described above;

the driving method includes:

in a data writing stage, turning on the data writing unit to transmit the data signal to the control terminal of the driving transistor through the data writing unit and the driving transistor, and to charge the energy storage unit; and in a light emitting stage, inputting a first power signal to the driving transistor through the energy storage unit to turn on the driving transistor, so that a signal of the second terminal of the driving transistor is transmitted to the first terminal of the first light emitting device; turning off the second switching unit, and turning on the first switching unit to make the first light emitting device emit light; or turning off the first switching unit, and turning on the second switching unit, wherein when a voltage value of the first power terminal is smaller than that of the second power terminal, the second light emitting device emits light; or, turning off the first switching unit, and turning on the second switching unit, wherein when the voltage value of the first power terminal is larger than that of the second power terminal, the third light emitting device emits light.

It should be noted that the above general description and the following detailed description are merely exemplary and explanatory and should not be construed as limiting of the disclosure.

BRIEF DESCRIPTION OF THE DRAWINGS

The accompanying drawings here, which are incorporated in and constitute a part of this disclosure, illustrate embodiments consistent with the present disclosure and, together with the description, serve to explain the principles of the present disclosure. Obviously, the drawings in the following description are only some embodiments of the present disclosure. For those of ordinary skill in the art, other drawings can be obtained based on these drawings without creative work.

FIG. 29 is a schematic diagram of an encapsulation layer according to an embodiment of the disclosure.

FIG. 30 is a flowchart of a manufacturing method for a display panel according to an embodiment of the disclosure.

FIG. 42 is a timing diagram of an operation principle of a pixel driving circuit according to a fourth implementation of the present disclosure.

FIG. 43 is a flowchart of an embodiment of a driving method for a pixel driving circuit according to the present disclosure.

DETAILED DESCRIPTION

Figure 1:
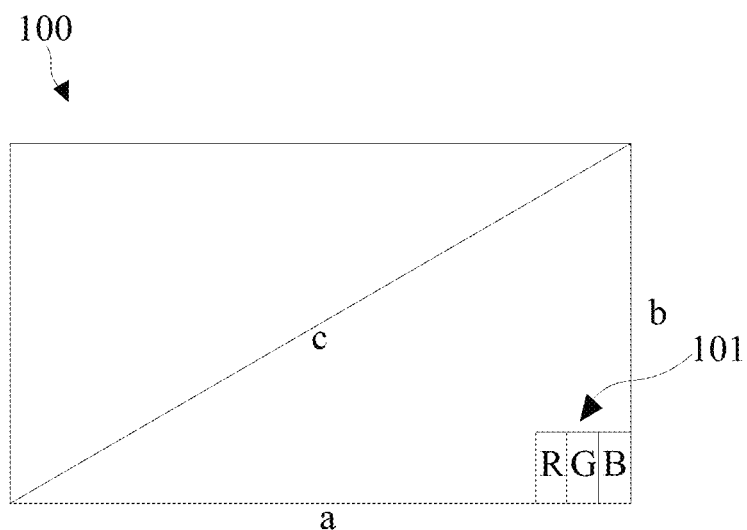
FIG. 1 is a schematic diagram of a tiled display panel in the related art.

Exemplary embodiments will now be described more fully with reference to the accompanying drawings. However, the exemplary embodiments can be implemented in a variety of forms and should not be construed as being limited to the examples set forth herein; rather, these embodiments are provided so that the present disclosure will be more full and complete so as to convey the idea of the exemplary embodiments to those skilled in this art. The same reference signs in the drawings denote the same or similar structures, and the detailed description thereof will be omitted. In addition, the drawings are merely schematic representations of the present disclosure and are not necessarily drawn to scale.

Although relative terms such as "above" and "below" are used in this specification to describe a relative relationship of one component to another component shown, these terms are only for convenience in this specification, for example, according to an exemplary direction shown in the drawings. It will be understood that if a device shown is flipped upside down, a component described "above" will become the component "below". When a structure is "on" another structure, it may mean that a structure is integrally formed on another structure, or that a structure is "directly" disposed on another structure, or that a structure is "indirectly" disposed on another structure through other structures.

The terms "one", "a", "the", "said", and "at least one" are used to indicate that there are one or more elements/components or the like; the terms "include" and "have" are used to indicate an open meaning of including and means that there may be additional elements/components/etc. in addition to the listed elements/components/etc.; and the terms "first", "second" "third" and "fourth" etc. are used only as markers, and do not limit the number of objects.

In the related art, a display panel 100 mainly includes a driving backplane and multiple light emitting units tiled on a side of the driving backplane and distributed in an array. In order to realize full-color display, three tiled sub-pixels are typically used to form one pixel 101, resulting in low utilization of a display area. As shown in FIG. 1, a is a length of the display panel 100, b is a width of the display panel 100, and c is a diagonal length of the display panel 100, a resolution of the pixel 101 is PPi=$\sqrt{a^2+b^2}$/c. In addition, during a manufacturing process, due to limitations of a process limit of a fine mask for evaporation, the PPi of the common display panel 100 is about 600, and the display resolution is relatively low.

Figure 2:
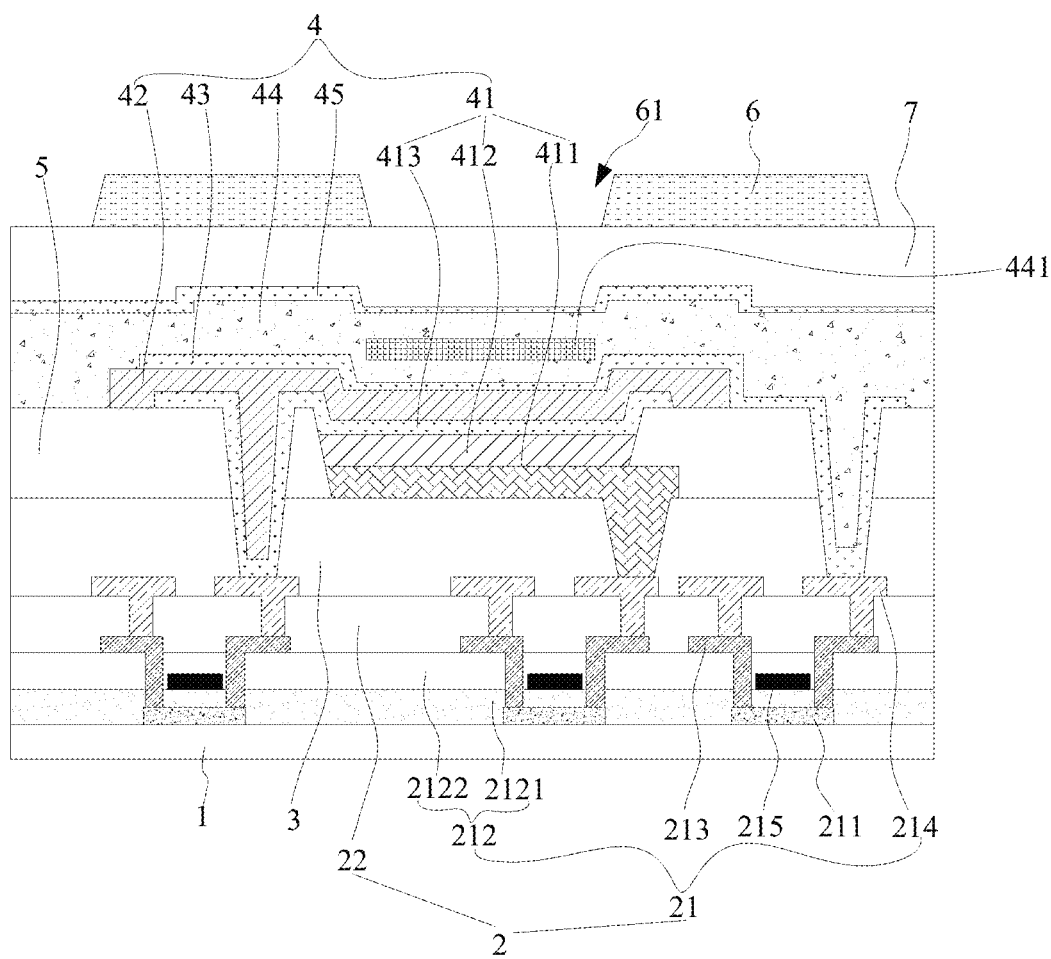
FIG. 2 is a schematic diagram of a display panel according to a first implementation of the present disclosure.
Figure 3:
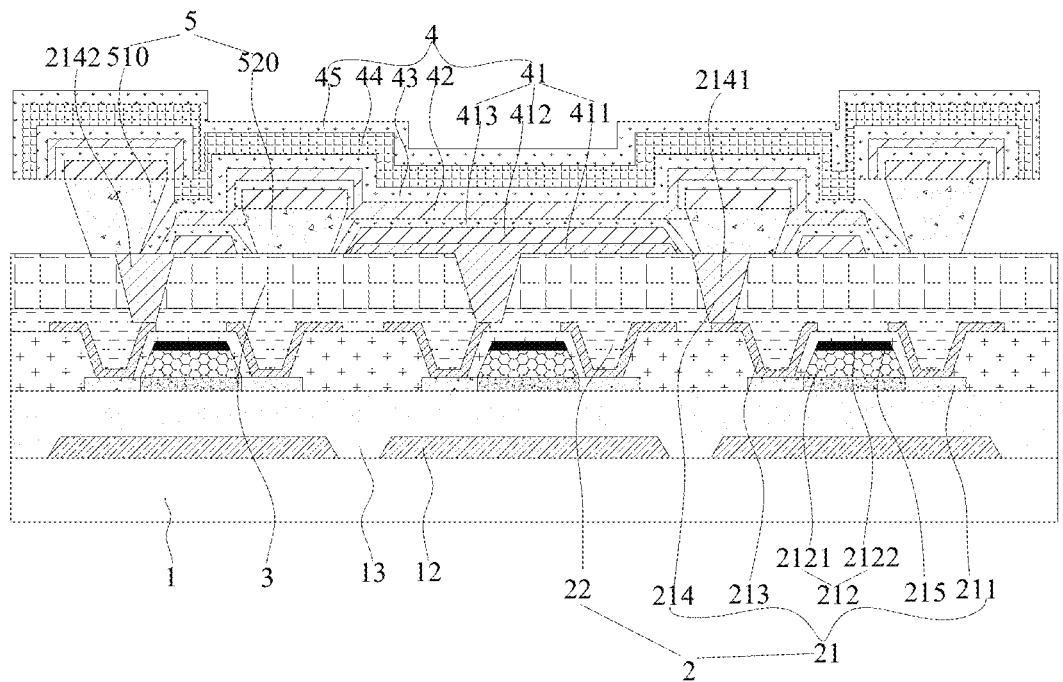
FIG. 3 is a schematic diagram of a display panel according to a second implementation of the present disclosure.
Figure 4:
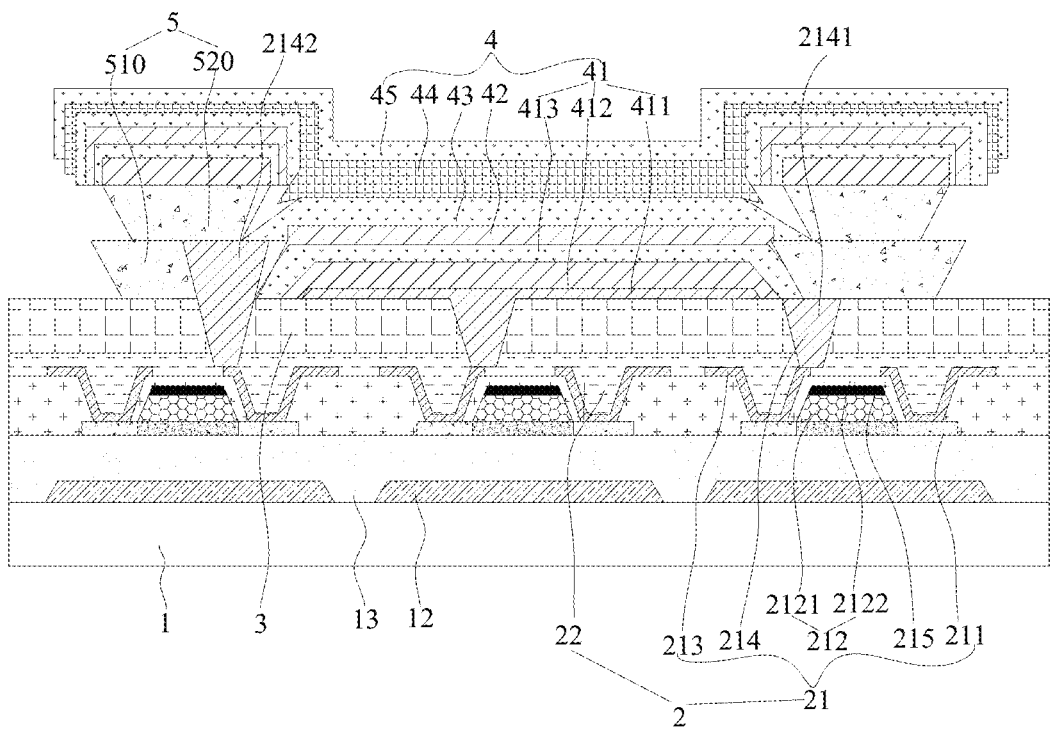
FIG. 4 is a schematic diagram of a display panel according to a third implementation of the present disclosure.

Embodiments of the present disclosure provide a display panel, and the display panel may be an active-matrix organic light emitting diode (AMOLED) display panel. As shown in FIGS. 2 to 4, the display panel may include a driving backplane 2 and a light emitting device layer 4.

The driving backplane 2 includes multiple pixel driving circuits 21;

the light emitting device layer 4 includes multiple light emitting units distributed in an array, the light emitting unit includes multiple light emitting devices 41 stacked in a direction away from the driving backplane 2, and light emitting devices 41 other than the light emitting device 41 closest to the driving backplane 2 in a direction perpendicular to the driving backplane 2 are transparent devices; and in the same light emitting unit, at least part of the light emitting devices 41 are coupled to the pixel driving circuits 21 for emitting light under driving of the pixel driving circuits 21, and at least two light emitting devices 41 in the same light emitting unit have different light emitting materials.

In the display panel of the present disclosure, the multiple light emitting devices 41 are stacked, which can increase the number of light emitting devices 41 in each light emitting unit, thereby increasing the number of light emitting devices 41 in a display region and improving utilization of the display region; in addition, since the at least two light emitting devices 41 in the same light emitting unit have the different light emitting materials so as to emit light of multiple colors, the light of multiple colors can be superimposed to achieve full color, thereby doubling the display resolution; in this process, since the pixel driving circuit 21 is coupled to the light emitting device 41, individual light emitting devices 41 can be driven separately through respective pixel driving circuits 21, so that individual light emitting devices 41 emit light independently without interfering with each other; in addition, since the light emitting devices 41 other than the light emitting device 41 closest to the driving backplane 2 in the direction perpendicular to the driving backplane 2 are the transparent devices, the light emitted by each light emitting device 41 can exit in a direction away from the driving backplane 2 to avoid the light irradiating to the pixel driving circuit 21, thereby ensuring stability of the pixel driving circuit 21.

FIGS. 2 to 4 show schematic structural diagrams of a display panel according to an embodiment of the present disclosure, and a light emitting principle of the display panel in the embodiments of the present disclosure will be described below in conjunction with FIGS. 2 to 4. The display panel mainly includes the driving backplane 2 and the light emitting device layer 4, and the driving backplane 2 can be disposed on a side of a substrate 1 and can include a pixel driving layer disposed on the side of the substrate 1, and the pixel driving layer includes the multiple pixel driving circuits 21 arranged side by side. The light emitting device layer 4 is disposed on a side of the pixel driving layer away from the substrate 1, and includes the multiple light emitting units distributed in an array. Each light emitting unit includes the multiple light emitting devices 41 stacked in the direction away from the driving backplane 2. Individual light emitting devices 41 have different light emitting materials and can respectively emit light of different colors. In the same light emitting unit, at least part of the light emitting devices 41 are coupled to the pixel driving circuits 21, and individual light emitting devices 41 can be powered on through respective pixel driving circuits 21. The individual light emitting devices 41 can be controlled in a timing sequence manner to emit light independently, so as to display an image. In some embodiments, the multiple light emitting devices 41 in the same light emitting unit can be simultaneously powered on, and can be controlled to simultaneously emit the light, so that the light of multiple colors can be superimposed, which can increase the utilization of the display region and increase the resolution of the display region.

In some embodiments of the present disclosure, the substrate 1 may be a flat plate structure, and may be made of a hard material such as glass or a flexible material such as polyimide (PI). The substrate 1 may be a single-layer or multi-layer structure, which is not specifically limited herein.

As shown in FIGS. 2 to 4, the pixel driving circuit 21 may include a transistor, which may be electrically coupled to the light emitting device 41, so that each light emitting device 41 is controlled by each transistor in a one-to-one correspondence, so as to display the image, and in this process, each light emitting device 41 emits the light independently without interfering with each other.

The transistor may include an active layer 211, a gate insulating layer 212, a gate 215 and a first source-drain layer 213. The gate insulating layer 212 may include a first gate insulating layer 2121 and a second gate insulating layer 2122. An active region can be doped multiple times to form the active layer 211 that may be located on a side of the substrate 1 close to the light emitting device layer 4. The first gate insulating layer 2121 covers the active layer 211; the gate 215 is disposed on a side of the first gate insulating layer 2121 away from the substrate 1; and the second gate insulating layer 2122 covers the gate 215 and the first gate insulating layer 2121. A hole can be formed in the first gate insulating layer 2121 and the second gate insulating layer 2122 to form a via hole coupled to the active region. An orthographic projection of the via hole on the substrate 1 does not overlap with an orthographic projection of the gate 215 on the substrate 1. The first source-drain layer 213 is formed on a side of the second gate insulating layer 2122 away from the substrate 1 and includes a source and a drain. The source and the drain can be coupled to both ends of the active layer 211 through via holes penetrating the second gate insulating layer 2122 and/or the first gate insulating layer 2121.

Figure 5:
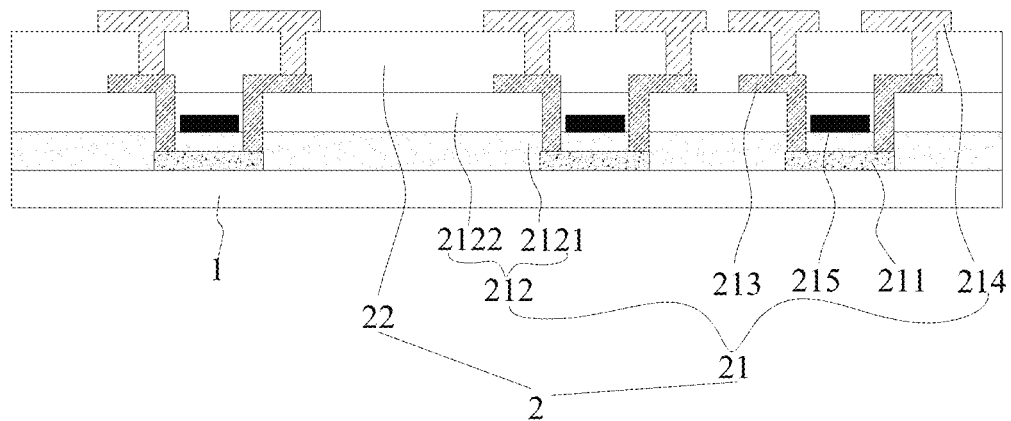
FIG. 5 a schematic diagram of a driving backplane according to a first implementation of the present disclosure.
Figure 6:
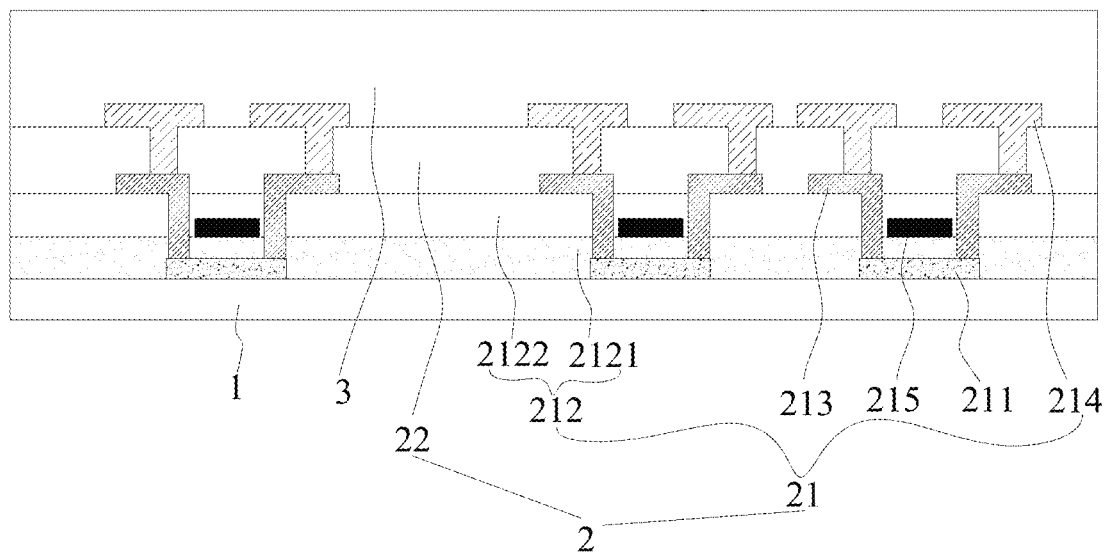
FIG. 6 is a schematic diagram of a planarization layer according to a first implementation of the present disclosure.

In addition, as shown in FIG. 5, the driving backplane 2 may further include a protective layer 22 covering the first source-drain layer 213 and a second source-drain layer 214 formed on a side of the protective layer 22 away from the substrate 1, and the protective layer 22 can cover a surface of the first source-drain layer 213 away from the substrate 1 and can be used to prevent hydrogen plasmas generated in subsequent processes from diffusing to each transistor; a hole can be formed in the protective layer 22 to form a via hole for coupling the first source-drain layer 213, the second source-drain layer 214 can be formed on the side of the protective layer 22 away from the substrate 1, and can be coupled to the first source-drain layer 213 of the transistor through the via hole penetrating the protective layer 22. As shown in FIG. 6, the display panel of the present disclosure may further include a planarization layer 3, and the planarization layer 3 can cover the protective layer 22 and the second source-drain layer 214 to eliminate a device gap (or height offset) of the second source-drain layer 214.

In an embodiment, as shown in FIGS. 3 and 4, the second source-drain layer 214 may include connecting leads, and the connecting leads may include a first lead 2141 and a second lead 2142 distributed at intervals. The first lead 2141 and the second lead 2142 can be respectively coupled to different pixel driving circuits 21 through via holes penetrating the planarization layer 3 and the protective layer 22.

In some embodiments of the present disclosure, the driving backplane 2 may further include a first light shielding layer 12 and a buffer layer 13.

The first light shielding layer 12 may be located between the driving backplane 2 and the substrate 1. As shown in FIGS. 3 to 4, the first light shielding layer 12 may be located on a side of the substrate 1 close to the driving backplane 2, and the first light shielding layer 12 can be used to prevent ambient light from being incident on the active layer 31 of the transistor to protect stability of the transistor.

In some embodiments, vacuum evaporation, magnetron sputtering, chemical vapor deposition, physical vapor deposition or the like may be used to form the first light shielding layer 12 on a side of the substrate 1 close to the driving backplane 2. By way of example, a photolithography process can be used to form the first light shielding layer 12, a light shielding film layer can be deposited on the side of the substrate 1 close to the driving backplane 2, and a photoresist is formed on a side of the light shielding film layer away from the substrate 1 and is exposed and developed through a mask to form a developing region. A pattern of the developing region can be the same as a pattern required by the first light shielding layer 12, and its size can be the same as a size of the pattern required by the first light shielding layer 12. The light shielding film layer can be anisotropically etched in the developing region to form the first light shielding layer 12, and finally the remaining photoresist on a surface of the first light shielding layer can be stripped to expose the first light shielding layer 12 formed by photolithography.

The buffer layer 13 may be located on a side of the first light shielding layer 12 away from the substrate 1, and may be formed on a surface of the first light shielding layer 12 away from the substrate 1 by using a process such as the chemical vapor deposition, the physical vapor deposition or atomic layer deposition. The buffer layer 13 can be used to block impurities in the substrate 1 from diffusing into the driving backplane 2 to protect the stability of the driving backplane 2. In some embodiments, the pixel driving layer may be formed on a surface of the buffer layer 13 away from the substrate 1.

In some embodiments of the present disclosure, individual light emitting devices 41 in the same light emitting unit can be stacked in the direction perpendicular to the driving backplane 2. Each light emitting device 41 can emit light of one color, and the individual light emitting devices 41 in the same light emitting unit can emit light of multiple different colors, the light emitted by the individual light emitting devices 41 in the direction perpendicular to the driving backplane 2 can be superimposed together. The individual light emitting devices 41 can be controlled in the timing sequence manner to emit light independently, thereby realizing the control of the luminous color.

In some embodiments, the number of light emitting devices 41 in the same light emitting unit can be two or three. In an embodiment, the number of light emitting devices 41 in the same light emitting unit is three, which are a first light emitting device, a second light emitting device and a third light emitting device, respectively. The first light emitting device is located on the side of the pixel driving layer away from the substrate 1, the second light emitting device is located on a surface of the first light emitting device away from the substrate 1, and the third light emitting device is located on a surface of the second light emitting device away from the substrate 1, and the first light emitting device, the second light emitting device, and the third light emitting device are respectively coupled to different pixel driving circuits 21 in the driving backplane 2 in a one-to-one correspondence.

Light emitting materials of these three light emitting devices 41 may be different from each other, and different light emitting materials may be used to emit light of different colors, which may be any combination of RGB. In order to improve the resolution and equalize light intensities of the light emitted by individual light emitting devices 41, a light intensity of the light emitted by the light emitting device 41 close to the side of the driving backplane 2 in the direction perpendicular to the driving backplane 2 can be greater than a light intensity of the light emitted by the light emitting device 41 away from the side of the driving backplane 2 in the direction perpendicular to the driving backplane 2, and during the use, even if the light of the light emitting device 41 located below is weakened due to transmittance, the overall display effect is not affected. In some embodiments, in the direction perpendicular to the driving backplane 2, a light intensity of the light emitted by the first light emitting device may be greater than a light intensity of the light emitted by the second light emitting device, and the light intensity of the light emitted by the second light emitting device may be greater than a light intensity of the light emitted by the third light emitting device.

It should be noted that the light emitted by these three light emitting devices 41 can also be the same, which can help prolong the service life of the light emitting devices.

Figure 7:
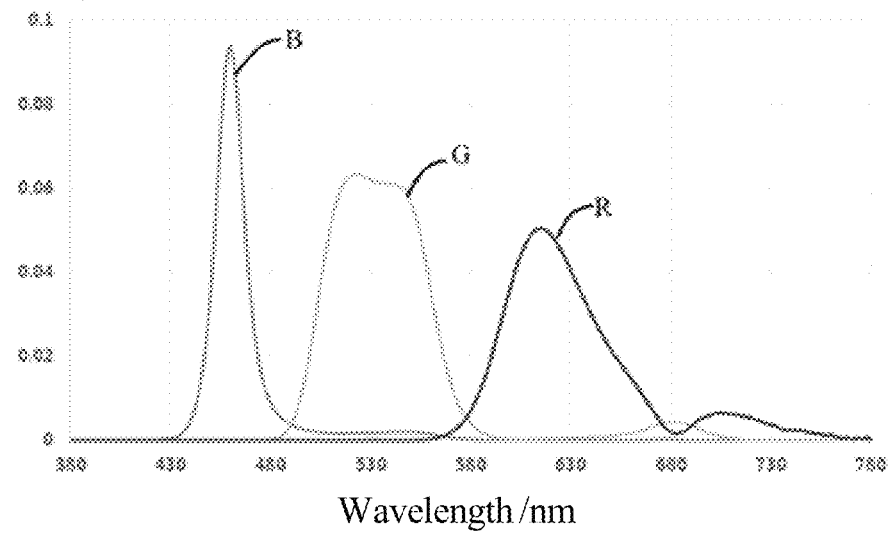
FIG. 7 is a schematic spectral diagram according to a first implementation of the present disclosure.
Figure 8:
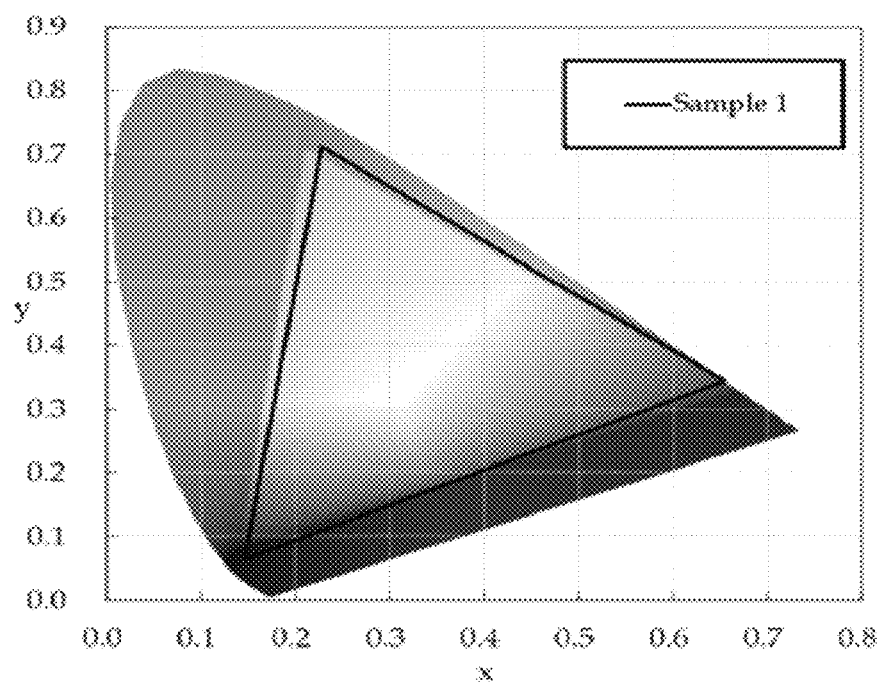
FIG. 8 is a schematic diagram of a color gamut of a display panel according to a first implementation of the present disclosure.

FIG. 7 shows a spectrum diagram of three colors of red, green, and blue. In the figure, an abscissa is a wavelength range, an ordinate is a light intensity, and peak positions in the curve are light intensities of the light of individual colors. It can be seen from the figure that a light intensity of blue light (B) is greater than that of green light (G), and the light intensity of the green light (G) is greater than that of red light (R), whereby a preferable solution is that a color of the light emitted by the first light emitting device is blue (B), a color of the light emitted by the second light emitting device is green (G), and a color of the light emitted by the third light emitting device is red (R), and the first light emitting device, the second light emitting device and the third light emitting device can emit the light at the same time, so that the display resolution can be increased by three times. FIG. 8 is a color gamut diagram of a display panel according to an embodiment of the present disclosure. In the figure, the abscissa and the ordinate are both chromaticity. After testing, the color gamut of the display panel in the embodiment is 96.8%.

In some embodiments of the present disclosure, the light emitting device 41 may include a first electrode layer 411, a light emitting functional layer 412, and a second electrode layer 413.

The first electrode layer 411 can be disposed on the side of the driving backplane 2, for example, it can be disposed on the side of the pixel driving layer away from the substrate 1, and can be coupled to the pixel driving circuit 21. The first electrode layer 411 can be used as an anode layer of the light emitting device 41, and its material can be a transparent conductive material or a light shielding material, which is not specifically limited herein. In some embodiments, the material can be ITO or AZO.

The light emitting functional layer 412 can be disposed on a surface of the first electrode layer 411 away from the driving backplane 2, and can provide a recombination place for excitons to emit light. The light emitting functional layer 412 can be a single-layer film layer or a multi-layer film layer, which is not specifically limited herein. Taking the multi-layer film layer as an example, the light emitting functional layer 412 can include a hole injection layer, a hole transport layer, an electron blocking layer, a light emitting layer, a hole blocking layer, an electron transport layer, and an electron injection layer.

The hole injection layer covers the surface of the first electrode layer 411 away from the driving backplane 2 to help enhance a hole injection capability of the devices. The hole transport layer covers a surface of the hole injection layer away from the first electrode layer 411, which can provide a transport channel for holes, improve a hole mobility, and help improve the luminous efficiency. The electron blocking layer covers a surface of the hole transport layer away from the first electrode layer 411, and can be used to block electrons from passing through the light emitting layer and moving towards the hole transport layer to avoid the recombination of electrons and holes in the hole transport layer, so as to ensure that a light emitting center is always located in the light emitting layer. The light emitting layer covers a surface of the electron blocking layer away from the first electrode layer 411, and the light emitting layer provides the recombination place for the electrons and the holes to emit the light. The hole blocking layer covers a surface of the light emitting layer away from the first electrode layer 411, and can be used to block the holes from passing through the light emitting layer and moving towards the electron transport layer to avoid the recombination of electrons and holesin the electron transport layer, so as to further ensure that the light emitting center is always located in the light emitting layer. The electron transport layer covers a surface of the hole blocking layer away from the first electrode layer 411, and can provide a transport channel for the electrons and improve an electron mobility. The electron injection layer covers a surface of the electron transport layer away from the first electrode layer 411, and can provide the transport channel for the electrons, improve the electron mobility and further improve the luminous efficiency. Each film layer in the light emitting functional layer 412 can be made of a transparent material, so as to increase a light transmittance and in turn increase a light extraction rate.

The second electrode layer 413 can be disposed on a surface of the light emitting functional layer 412 away from the driving backplane 2, and can be a metal oxide electrode, a metal electrode, a metal alloy electrode, or a composite electrode formed by a combination of the metal and the metal oxide, which is not specifically limited herein. The second electrode layer 413 can be used as a cathode layer of the light emitting device 41, and a voltage can be applied to the first electrode layer 411 and the second electrode layer 413 to make the light emitting functional layer 412 emit the light.

Figure 9:
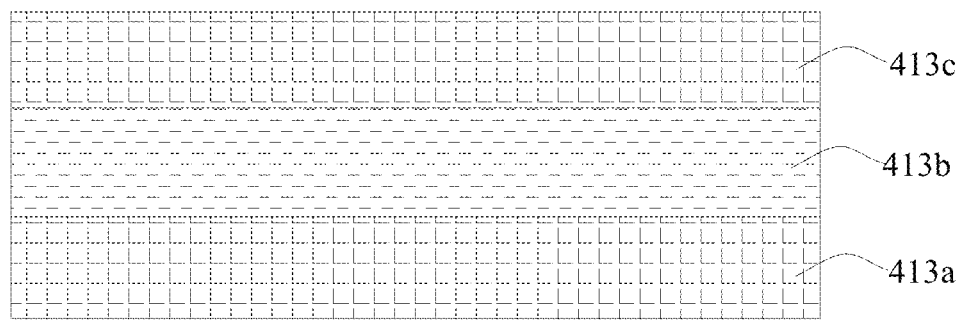
FIG. 9 is a schematic structural diagram of a second electrode layer according to an embodiment of the present disclosure.

In an embodiment of the present disclosure, a material of the second electrode layer 413 may be the IZO with a higher light transmittance, and the second electrode layer 413 may be formed on the surface of the light emitting functional layer 412 away from the first electrode layer 411 by a sputtering process. In another embodiment of the present disclosure, as shown in FIG. 9, the second electrode layer 413 includes a first electrode modification layer 413a, an electrode layer 413b, and a second electrode modification layer 413c that are stacked. The first electrode modification layer 413a is located on the surface of the light emitting functional layer 412 away from the driving backplane 2, the second electrode modification layer 413c is located on a side of the first electrode modification layer 413a away from the driving backplane 2, and the electrode layer 413b is located between the first electrode modification layer 413a and the second electrode modification layer 413c. A conductivity of the electrode layer 413b is greater than conductivities of the first electrode modification layer 413a and the second electrode modification layer 413c, and the first electrode modification layer 413a, the electrode layer 413b, and the second electrode modification layer 413c can form a DMD structure to improve the light transmittance. In some embodiments, the first electrode modification layer 413a, the electrode layer 413b, and the second electrode modification layer 413c may all be light transmitting materials. By way of example, the material of the first electrode modification layer 413a may be molybdenum oxide, the material of the electrode layer 413b may be aluminum-silver alloy, and the material of the second electrode modification layer can be molybdenum oxide. Note that, other light transmitting materials may also be possible, which will not be listed here.

In the same light emitting unit, among two adjacent light emitting devices 41 in the direction perpendicular to the driving backplane 2, a second electrode layer 413 of a light emitting device closer to the driving backplane 2 and a first electrode layer 411 of a light emitting device 41 away from the driving backplane 2 can be the same electrode layer, thereby reducing the number of electrodes in the light emitting unit and alleviating the decrease of the device efficiency due to an electrode transmittance.

In some embodiments of the present disclosure, the light emitting devices 41 other than the light emitting device 41 closest to the driving backplane 2 may be transparent light emitting devices, and a side of the light emitting device 41 closest to the driving backplane 2 that is close to the driving backplane 2 can have a light shielding design to ensure that the light emitted by all the light emitting devices 41 can exit in the direction away from the driving backplane 2, avoiding the light irradiating to the driving backplane 2, and ensuring the stability of the pixel driving circuits 21 in the driving backplane 2. It should be noted that the light emitting device 41 closest to the driving backplane 2 may also be the transparent device, which is not specifically limited herein.

Figure 10:
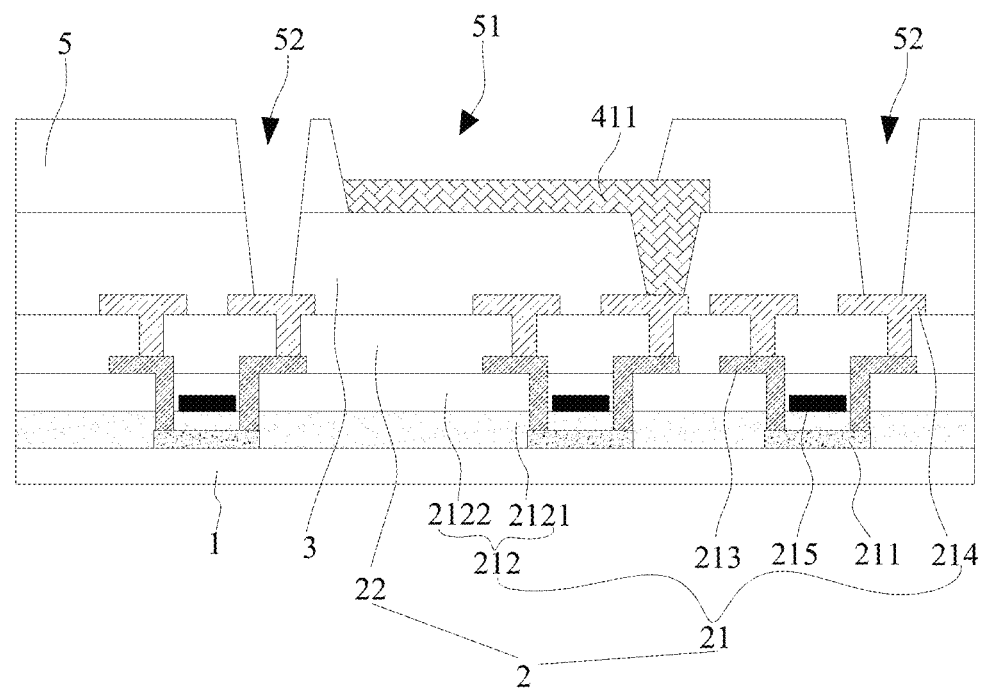
FIG. 10 is a schematic diagram of a pixel definition layer according to a first implementation of the present disclosure.
Figure 11:
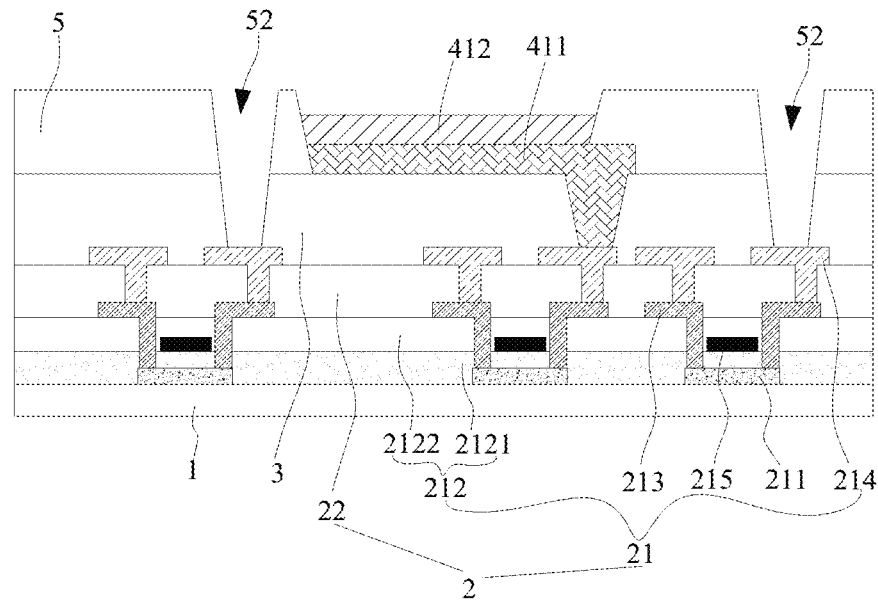
FIG. 11 is a schematic diagram of a light emitting functional layer according to a first implementation of the present disclosure.
Figure 12:
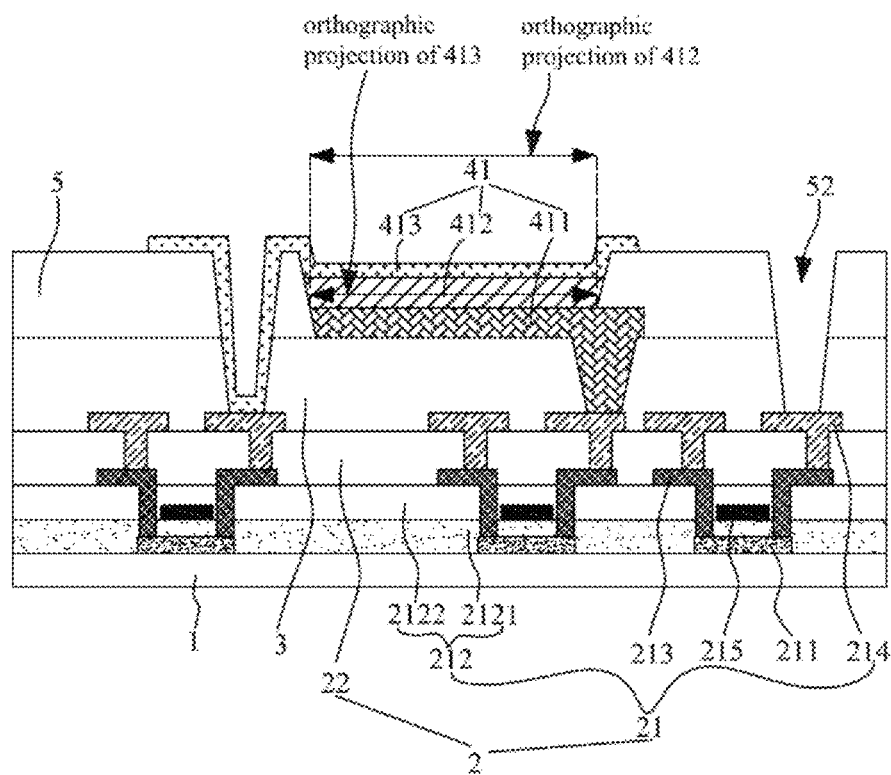
FIG. 12 is a schematic diagram of a second electrode layer according to a first implementation of the present disclosure.

In order to define a range of each light emitting unit in the light emitting functional layer 412, the display panel of the present disclosure further includes a pixel definition layer 5. As shown in FIGS. 10 to 12, the pixel definition layer 5 may be disposed on the side of the driving backplane 2. In some embodiments, the pixel definition layer 5 may be located on the side of the pixel driving layer away from the substrate 1, and the first electrode layer 411 of the first light emitting device may be disposed on the same side of the driving backplane 2 as the pixel definition layer 5.

A structure and specific details of the pixel definition layer 5 will be described in detail below through various embodiments.

In a first implementation of the present disclosure, as shown in FIG. 10, the pixel definition layer 5 may be provided with multiple openings 51, and each opening 51 may expose the first electrode layer 411 of one first light emitting device. As shown in FIG. 11, the light emitting functional layer 412 of the first light emitting device may be formed on a surface of the first electrode layer 411 of the first light emitting device away from the driving backplane 2, and may be at least partially located in the opening 51. As shown in FIG. 12, the second electrode layer 413 of the first light emitting device can be disposed on a surface of the pixel definition layer 5 away from the driving backplane 2, and is coupled to the pixel driving circuit 21 through a via hole 52 penetrating the pixel definition layer 5, so as to power on the second electrode layer 413 of the first light emitting device through the pixel driving circuit 21. An orthographic projection of the second electrode layer 413 of the first light emitting device in the opening 51 at least partially overlaps with an orthographic projection of the light emitting functional layer 412 of the first light emitting device in the opening 51, and the second electrode layer 413 of the first light emitting device is in contact with the light emitting functional layer 412 of the first light emitting device. The light emitting functional layer 412 of the first light emitting device and the second electrode layer 413 of the first light emitting device within a range of the opening 51 and the first electrode layer 411 of the first light emitting device exposed by the opening 51 can jointly constitute the first light emitting device.

Figure 13:
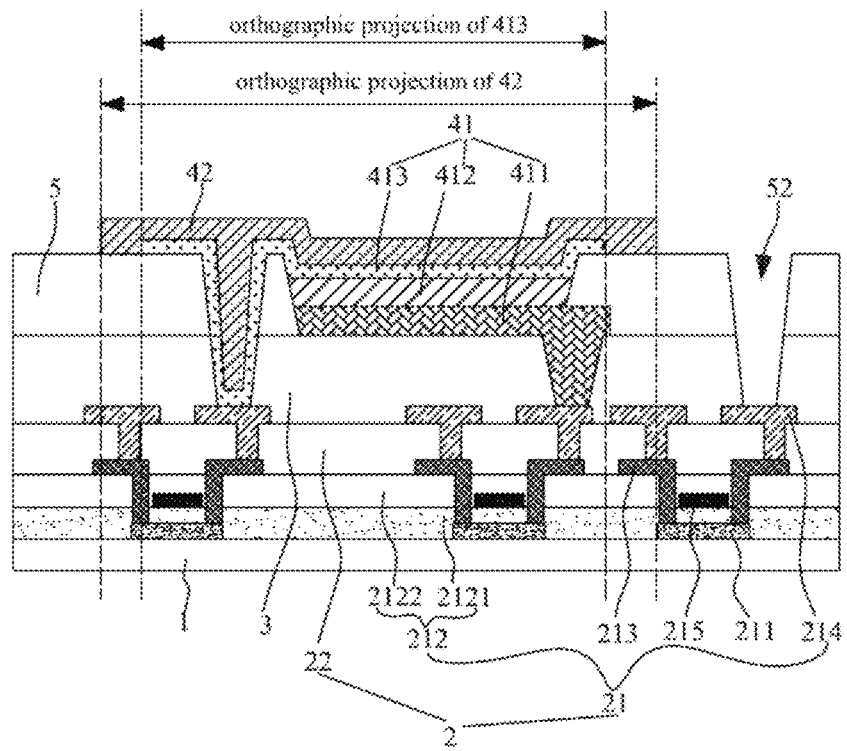
FIG. 13 is a schematic diagram of a light emitting functional layer of a second light emitting device according to a first implementation of the present disclosure.
Figure 14:
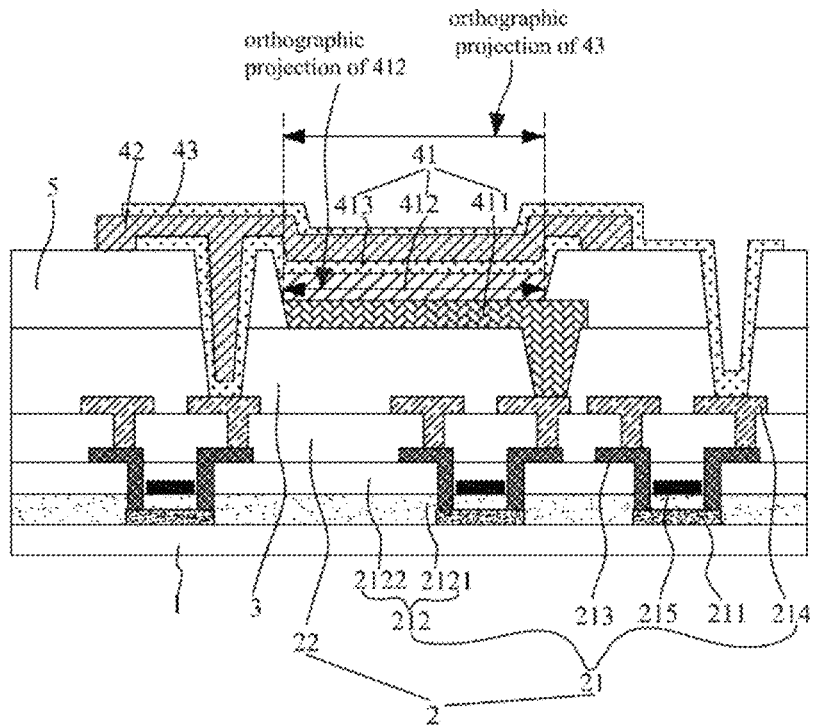
FIG. 14 is a schematic diagram of a second electrode layer of a second light emitting device according to a first implementation of the present disclosure.

The second light emitting device may share an electrode with the first light emitting device. In some embodiments, the first electrode layer of the second light emitting device may be the second electrode layer 413 of the first light emitting device. As shown in FIG. 13, the light emitting functional layer 42 of the second light emitting device covers a surface of the second electrode layer 413 of the first light emitting device away from the driving backplane 2, and its orthographic projection on the driving backplane 2 covers an orthographic projection of the second electrode layer 413 of the first light emitting device on the driving backplane 2. In some embodiments, the light emitting functional layer 42 of the second light emitting device can cover at least a region of the opening 51, and its two ends can extend outward from the region of the opening 51, and two ends of the second electrode layer 413 of the first light emitting device are wrapped with the two ends of the light emitting functional layer 42 of the second light emitting device, respectively, so as to prevent the contact and the short circuit between the second electrode layer 43 of the second light emitting device formed subsequently and the second electrode layer 413 of the first light emitting device. As shown in FIG. 14, the second electrode layer 43 of the second light emitting device can cover surfaces of the light emitting functional layer 42 of the second light emitting device and the pixel definition layer 5, and its orthographic projection in the opening 51 at least partially overlaps with the orthographic projection of the light emitting functional layer 412 of the first light emitting device in the opening 51. In some embodiments, the second electrode layer 43 of the second light emitting device at least extends to the region of the opening 51, and can be coupled to the pixel driving circuit 21 through the via hole 52 penetrating the pixel definition layer 5. The second electrode layer 413 of the first light emitting device, the light emitting functional layer 42 of the second light emitting device and the second electrode layer 43 of the second light emitting device may jointly constitute the second light emitting device.

Figure 15:
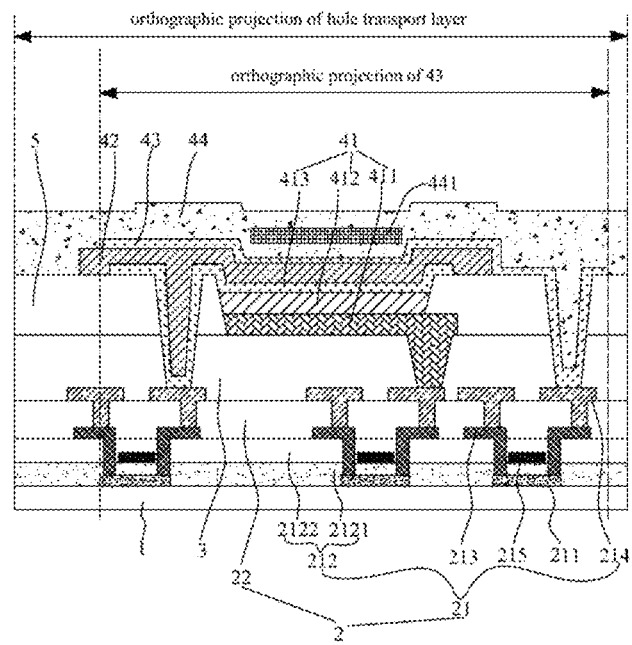
FIG. 15 is a schematic diagram of a light emitting functional layer of a third light emitting device according to a first implementation of the present disclosure.

The third light emitting device can share an electrode with the second light emitting device. In some embodiments, the first electrode layer of the third light emitting device is the second electrode layer 43 of the second light emitting device. As shown in FIG. 15, the light emitting functional layer 44 of the third light emitting device covers a surface of the second electrode layer 43 of the second light emitting device away from the driving backplane 2, and its orthographic projection on the driving backplane 2 covers an orthographic projection of the second electrode layer 43 of the second light emitting device on the driving backplane 2. In some embodiments, the light emitting functional layer 44 of the third light emitting device can cover at least the region of the opening 51, and two ends of the second electrode layer 43 of the second light emitting device can be wrapped with two ends of the light emitting functional layer 44 of the third light emitting device, respectively, so as to prevent the contact and the short circuit between the second electrode layer 45 of the third light emitting device subsequently formed and the second electrode layer 43 of the second light emitting device.

Figure 16:
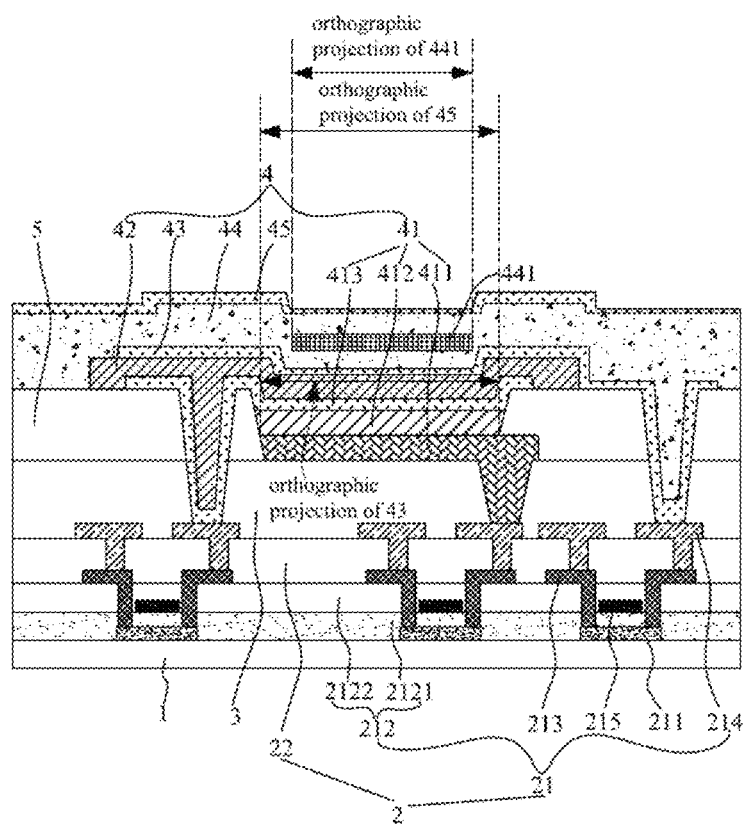
FIG. 16 is a schematic diagram of a second electrode layer of a third light emitting device according to a first implementation of the present disclosure.

As shown in FIG. 16, the second electrode layer 45 of the third light emitting device can cover a surface of the light emitting functional layer 44 of the third light emitting device, and can extend at least to the region of the opening 51, or may also cover the entire surface of the light emitting functional layer 44 of the third light emitting device, which is not specifically limited herein. The second electrode layer 45 of the third light emitting device may be coupled to an external power source through a circuit on a periphery of the light emitting unit so as to be powered on. The second electrode layer 43 of the second light emitting device, the light emitting functional layer 44 of the third light emitting device and the second electrode layer 45 of the third light emitting device may jointly constitute the third light emitting device.

In an embodiment, the light emitting functional layer 44 of the third light emitting device may include the hole transport layer, a light emitting material layer 441 and the electron transport layer that are sequentially stacked. The hole transport layer may be located on a side of the second electrode layer 43 of the second light emitting device away from the driving backplane 2, and its orthographic projection on the driving backplane 2 covers the orthographic projection of the second electrode layer 43 of the second light emitting device on the driving backplane 2. In some embodiments, the hole transport layer can cover at least the region of the opening 51, and its two ends can extend outward from the region of the opening 51, and the two ends of the second electrode layer 43 of the second light emitting device are wrapped with the two ends of the hole transport layer, respectively. By way of example, the hole transport layer can cover the entire surface of the second electrode layer 43 of the second light emitting device, and also covers surfaces of the light emitting functional layer 42 of the second light emitting device and the pixel definition layer 5 that are not covered by the second electrode layer 43 of the second light emitting device. The light emitting material layer 441 is located on a side of the hole transport layer away from the driving backplane 2, and its orthographic projection in the opening 51 at least partially overlaps with an orthographic projection of the second electrode layer 43 of the second light emitting device in the opening 51. In some embodiments, the light emitting material layer 441 may be disposed at least in the region of the opening 51 so as to emit the light in the region of the opening 51. The electron transport layer can cover a surface of a structure jointly formed by the light emitting material layer 441 and the hole transport layer. In some embodiments, it can at least completely cover the light emitting material layer 441 in the opening 51. In addition, it can also completely cover a structure jointly formed by the light emitting material layer 441 and the hole transport layer of the third light emitting device. The second electrode layer 45 of the third light emitting device may be located on a side of the electron transport layer away from the driving backplane 2, and its orthographic projection in the opening 51 at least partially overlaps with an orthographic projection of the light emitting material layer 441 in the opening 51, to ensure that the light emitting material layer 441 located in the opening 51 normally emits the light.

It should be noted that the light emitting functional layer 44 of the third light emitting device may further include the hole injection layer and the electron injection layer. The hole injection layer may be located between the second electrode layer 43 of the second light emitting device and the hole transport layer, and may be used to improve the hole injection capability of the third light emitting device, thereby increasing the hole mobility. The electron injection layer can be located between the second electrode layer 45 and the electron transport layer of the third light emitting device, and can be used to improve the electron injection capability of the third light emitting device, thereby improving the electron mobility.

In an embodiment, third light emitting devices of individual light emitting units can share the hole transport layer and the electron transport layer. The hole transport layer of the third light emitting devices of the individual light emitting units can be simultaneously formed by a single process, and the electron transport layer of the third light emitting devices of the individual light emitting units can also be simultaneously formed by the single process. In addition, when each third light emitting device includes the electron injection layer and the hole injection layer, the third light emitting devices of the individual light emitting units can share the electron injection layer and the hole injection layer. The electron injection layer of the third light emitting devices of the individual light emitting units can be simultaneously formed by the single process, and the hole injection layer of the third light emitting devices of the individual light emitting units can also be simultaneously formed by the single process, thereby simplifying the process and reducing the manufacturing cost.

In a second implementation of the present disclosure, as shown in FIGS. 17-22, the pixel definition layer 5 may include a first pixel definition layer 510 and a second pixel definition layer 520.

Figure 17:
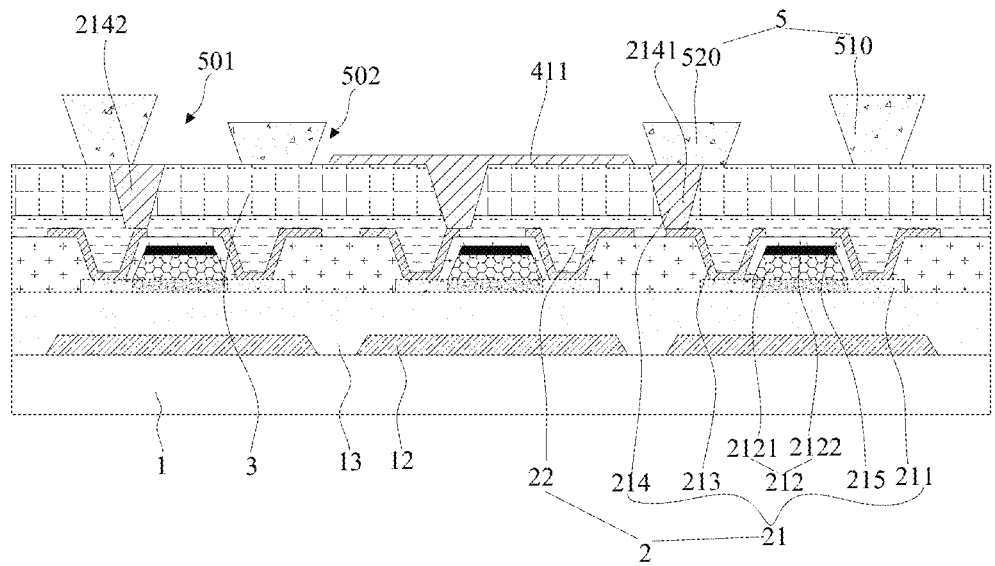
FIG. 17 is a schematic diagram of a pixel definition layer according to a second implementation of the present disclosure.

As shown in FIG. 17, the first pixel definition layer 510 can be disposed on the same side of the driving backplane 2 as the first electrode layer 411 of the first light emitting device, for example, it can be disposed on a surface of the planarization layer 3 away from the substrate 1. The first pixel definition layer 510 may be provided with multiple first openings exposing the first electrode layer 411 of each first light emitting device, and a sidewall of the first opening can be shrunk toward a side away from the driving backplane 2 from a side close to the driving backplane 2.

The second pixel definition layer 520 and the first pixel definition layer 510 can be disposed on the same side of the driving backplane 2, that is, the second pixel definition layer 520 can also be disposed on the surface of the planarization layer 3 away from the substrate 1. The second pixel definition layer 520 may be located within the first opening and have a first gap 501 with the sidewall of the first opening, the second lead 2142 may be at least partially exposed in the first gap 501, and an orthographic projection of a side of the first opening away from the driving backplane 2 on the planarization layer 3 does not overlap with the second lead 2142.

The second pixel definition layer 520 may be provided with a second opening, and a sidewall of the second opening can be shrunk toward the side away from the driving backplane 2 from the side close to the driving backplane 2. In addition, a sidewall of the second pixel definition layer 520 close to the first gap 501 can also be shrunk toward the side away from the driving backplane 2 from the side close to the driving backplane 2. In some embodiments, the second pixel definition layer 520 can be a ring-shaped structure formed in the first opening of the first pixel definition layer 510, and a cross-section of the ring-shaped structure in the direction perpendicular to the driving backplane 2 may be inverted trapezoidal, T-shaped or I-shaped.

In the direction perpendicular to the driving backplane 2, a height of the second pixel definition layer 520 may be lower than a height of the first pixel definition layer 510, so that when subsequent film layers are formed, each film layer can be automatically disconnected at the opening of the first pixel definition layer 510 or the second pixel definition layer 520, avoiding the use of a fine mask, thereby reducing the manufacturing cost.

The specific heights of the first pixel definition layer 510 and the second pixel definition layer 520 can be set according to a thickness of each film layer in each light emitting unit, so that each film layer breaks at the corresponding position through the first pixel definition layer 510 and the second pixel definition layer 520, avoiding the use of the fine mask, which can reduce alignment accuracy requirements for the mask, simplify the process, and reduce the manufacturing cost.

In some embodiments, the height of the first pixel definition layer 510 may range from 1 um to 2 um, and the height of the second pixel definition layer 520 may range from 0.2 um to 1 um. In other embodiments, the height of the first pixel definition layer 510 may be 0.7 um, and the height of the second pixel definition layer 520 may be 1.4 um.

It should be noted that the first electrode layer 411 of the first light emitting device may be located within the second opening, and may have a second gap 502 with the sidewall of the second opening. The first lead 2141 may be at least partially exposed in the second gap 502.

Figure 18:
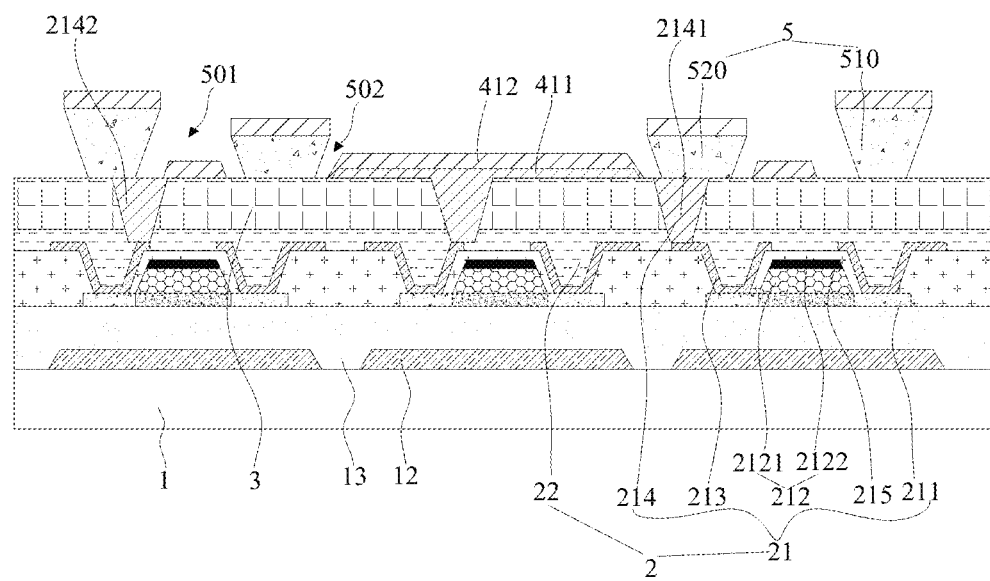
FIG. 18 is a schematic diagram of a light emitting functional layer of a first light emitting device according to a second implementation of the present disclosure.

As shown in FIG. 18, the light emitting functional layer 412 of the first light emitting device may be formed on a surface of the first electrode layer 411 of the first light emitting device away from the driving backplane 2, and may be at least partially disposed in the second opening. The light emitting functional layer 412 of the first light emitting device can be continuously distributed in the second opening, and ends of the first electrode layer 411 of the first light emitting device can be wrapped with the light emitting functional layer 412 of the first light emitting device to avoid the contact and the short circuit between the second electrode layer 413 of the first light emitting device subsequently formed and the first electrode layer 411 of the first light emitting device. In addition, in the manufacturing process, the light emitting functional layer 412 of the first light emitting device can be automatically disconnected at a boundary of the second opening, avoiding the use of the fine mask and reducing the manufacturing cost.

Figure 19:
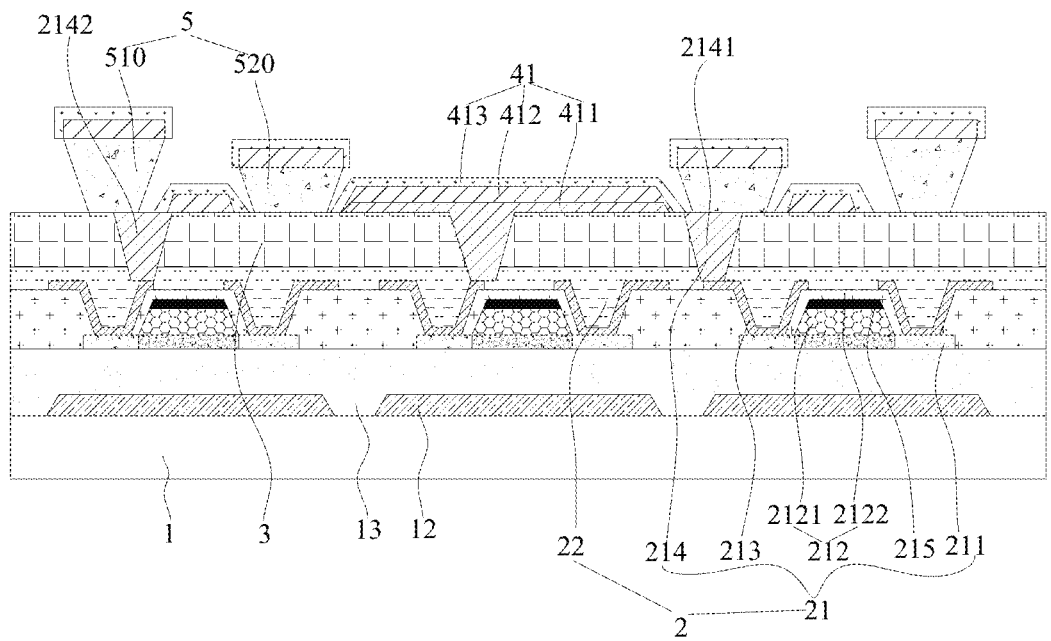
FIG. 19 is a schematic diagram of a second electrode layer of a first light emitting device according to a second implementation of the present disclosure.

As shown in FIG. 19, the second electrode layer 413 of the first light emitting device can be disposed on a side of the light emitting functional layer 412 of the first light emitting device away from the driving backplane 2, and can be at least partially disposed in the second opening, and can at least partially cover the first lead 2141, so that the second electrode layer 413 of the first light emitting device can be coupled to the pixel driving circuit 21 through the first lead 2141, and then the second electrode layer 413 of the first light emitting device can be powered on through the pixel driving circuit 21. In the manufacturing process, the second electrode layer 413 of the first light emitting device can be automatically disconnected at the boundary of the second opening, avoiding the use of the fine mask and further reducing the manufacturing cost.

An orthographic projection of the second electrode layer 413 of the first light emitting device in the second opening at least partially overlaps with an orthographic projection of the light emitting functional layer 412 of the first light emitting device in the second opening 5, and the light emitting functional layer 412 of the first light emitting device and the second electrode layer 413 of the first light emitting device in a range of the second opening and the first electrode layer 411 of the first light emitting device exposed by the second opening may jointly constitute the first light emitting device.

Figure 20:
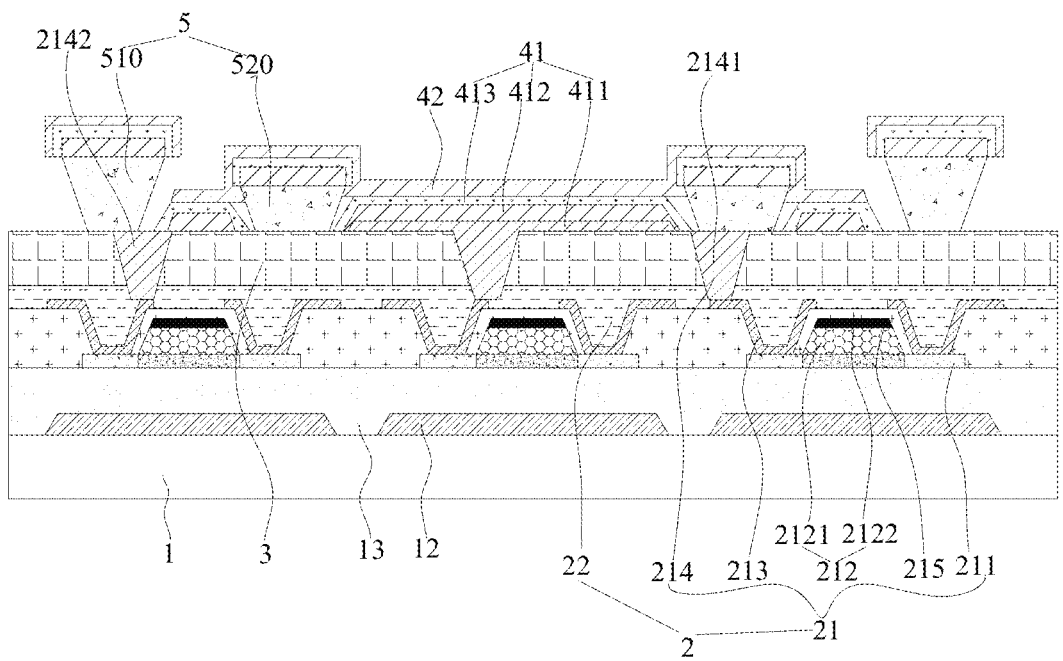
FIG. 20 is a schematic diagram of a light emitting functional layer of a second light emitting device according to a second implementation of the present disclosure.

The second light emitting device may share an electrode with the first light emitting device, for example, the first electrode layer of the second light emitting device may be the second electrode layer 413 of the first light emitting device. As shown in FIG. 20, the light emitting functional layer 42 of the second light emitting device covers a surface of the second electrode layer 413 of the first light emitting device away from the driving backplane 2, is continuously distributed in the second opening, and can fill the second gap. In the manufacturing process, the light emitting functional layer 42 of the second light emitting device can be disconnected at a boundary of the first opening, and in this process, since the orthographic projection of the side of the first opening away from the driving backplane 2 on the planarization layer 3 does not overlap with the second lead 2142, after the formed light emitting functional layer 42 of the second light emitting device is disconnected at the boundary of the first opening, the second lead 2142 is not covered, so that the second lead 2142 can be exposed.

Figure 21:
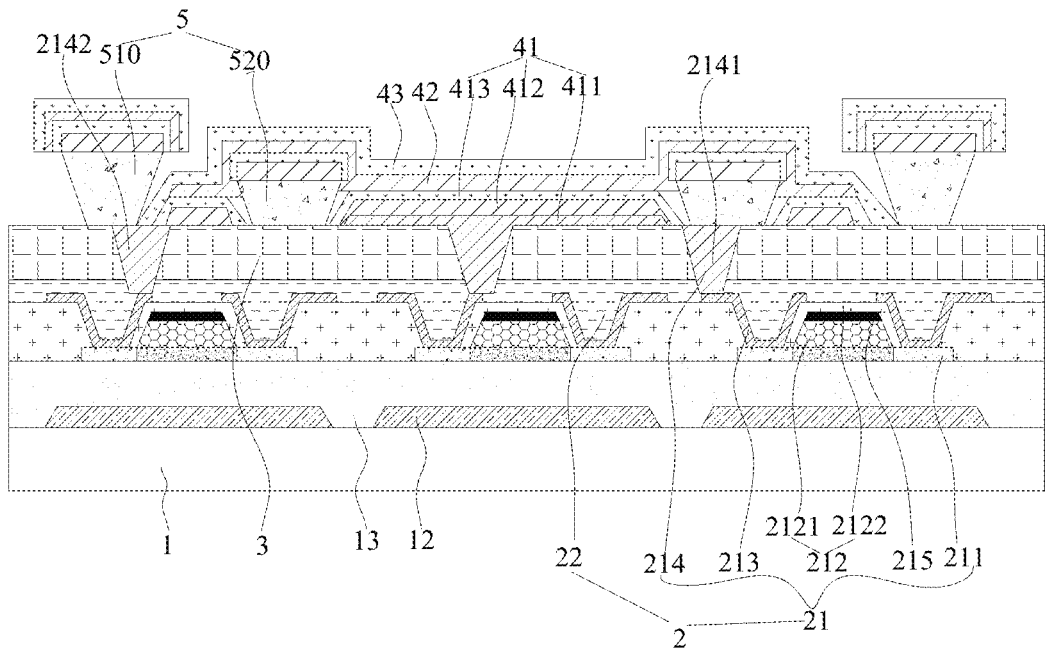
FIG. 21 is a schematic diagram of a second electrode layer of a second light emitting device according to a second implementation of the present disclosure.

As shown in FIG. 21, the second electrode layer 43 of the second light emitting device may at least partially cover a surface of the light emitting functional layer 42 of the second light emitting device away from the driving backplane 2, and may at least partially cover the second lead 2142, so that the second electrode layer 43 of the second light emitting device can be coupled to the pixel driving circuit 21 through the second lead 2142, and then the second electrode layer 43 of the second light emitting device can be powered on through the pixel driving circuit 21. In the manufacturing process, the second electrode layer 43 of the second light emitting device can be automatically disconnected at the boundary of the first opening, avoiding the use of the fine mask, which not only reduces the alignment accuracy requirements for the mask, but also reduces the manufacturing cost.

The light emitting functional layer 42 of the second light emitting device, the second electrode layer 43 of the second light emitting device and the first electrode layer of the second light emitting device may jointly constitute the second light emitting device. An orthographic projection of the second electrode layer 43 of the second light emitting device on the driving backplane 2 at least partially overlaps with an orthographic projection of the light emitting functional layer 412 of the first light emitting device on the driving backplane 2, so that the light emitted by the first light emitting device is superimposed with the light emitted by the second light emitting device, which can improve the utilization of the display panel and the display resolution.

Figure 22:
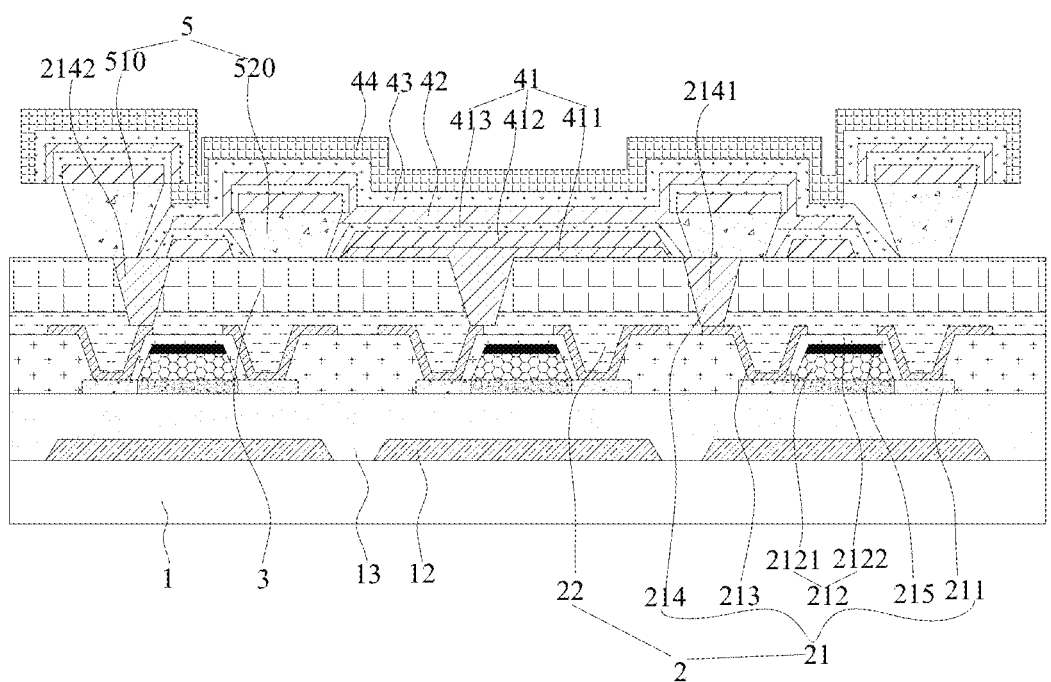
FIG. 22 is a schematic diagram of a light emitting functional layer of a third light emitting device according to a second implementation of the present disclosure.

The third light emitting device can share an electrode with the second light emitting device, for example, the first electrode layer of the third light emitting device is the second electrode layer 43 of the second light emitting device. As shown in FIG. 22, the light emitting functional layer 44 of the third light emitting device is located on a side of the first electrode layer 43 of the third light emitting device away from the driving backplane 2, and its orthographic projection on the driving backplane 2 can cover an orthographic projection of the first electrode layer 43 of the third light emitting device on the driving backplane 2; in some embodiments, the light emitting functional layer 44 of the third light emitting device can at least cover a first opening region and can fill the first gap 501, and then ends of the second electrode layer 43 of the second light emitting device are wrapped with the light emitting functional layer 44 of the third light emitting device to avoid the contact and the short circuit between the second electrode layer 45 of the third light emitting device subsequently formed and the second electrode layer 43 of the second light emitting device.

The second electrode layer 45 of the third light emitting device can cover a surface of the light emitting functional layer 44 of the third light emitting device away from the driving backplane 2, and its orthographic projection on the driving backplane 2 can cover an orthographic projection of the light emitting functional layer 44 of the third light emitting device on the driving backplane 2. The second electrode layer 45 of the third light emitting device can be coupled to an external power source through a circuit on the periphery of the light emitting unit so as to be powered on. The second electrode layer 43 of the second light emitting device, the light emitting functional layer 44 of the third light emitting device, and the second electrode layer 45 of the third light emitting device may jointly constitute the third light emitting device.

In a third implementation of the present disclosure, as shown in FIGS. 23-27, the pixel definition layer 5 may include a first pixel definition layer 510 and a second pixel definition layer 520.

Figure 23:
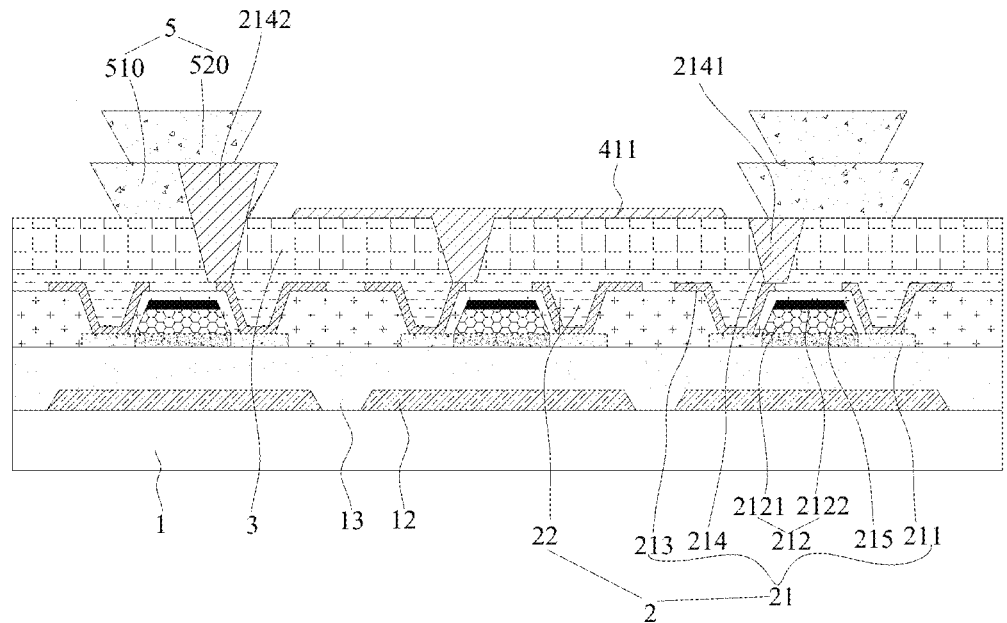
FIG. 23 is a schematic diagram of a pixel definition layer according to a third implementation of the present disclosure.

As shown in FIG. 23, the first pixel definition layer 510 can be disposed on the same side of the driving backplane 2 as the first electrode layer 411 of the first light emitting device, for example, it can be disposed on the surface of the planarization layer 3 away from the substrate 1. The first pixel definition layer 510 may be provided with multiple first openings exposing the first electrode layer 411 of each first light emitting device and at least partially exposing the first lead 2141, and a sidewall of the first opening can be shrunk toward a side away from the driving backplane 2 from a side close to the driving backplane 2. It should be noted that the second lead 2142 can penetrate the first pixel definition layer 510 and is exposed on a surface of the first pixel definition layer 510 away from the driving backplane 2 so as to be coupled to other electrode layers or connecting lines.

The second pixel definition layer 520 can be disposed on a surface of the first pixel definition layer 510 away from the driving backplane 2, and has multiple second openings exposing each first opening. A sidewall of the second opening is shrunk toward the side away from the driving backplane 2 from the side close to the driving backplane 2. In an embodiment, a bottom of the second opening may at least partially expose the second lead 2142, and an orthographic projection of a top of the second opening on the first pixel definition layer 510 does not overlap with the second lead 2142.

Figure 24:
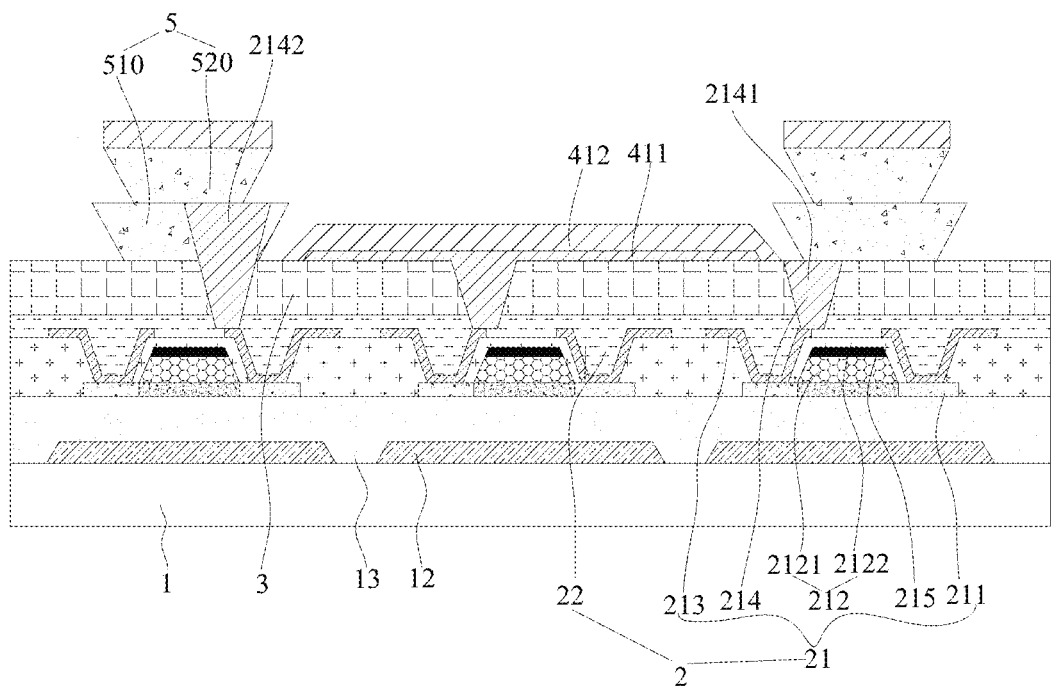
FIG. 24 is a schematic diagram of a light emitting functional layer of a first light emitting device according to a third implementation of the present disclosure.

As shown in FIG. 24, the light emitting functional layer 412 of the first light emitting device may be formed on a surface of the first electrode layer 411 of the first light emitting device away from the driving backplane 2, and may be at least partially disposed in the first opening. The ends of the first electrode layer 411 of the first light emitting device can be wrapped with the light emitting functional layer 412 of the first light emitting device in the first opening to avoid the contact and the short circuit between the second electrode layer 413 of the first light emitting device subsequently formed and the first electrode layer 411 of the first light emitting device. In addition, in the manufacturing process, the light emitting functional layer 412 of the first light emitting device can be automatically disconnected at a boundary of the first opening or the second opening, avoiding the use of the fine mask and reducing the manufacturing cost.

Figure 25:
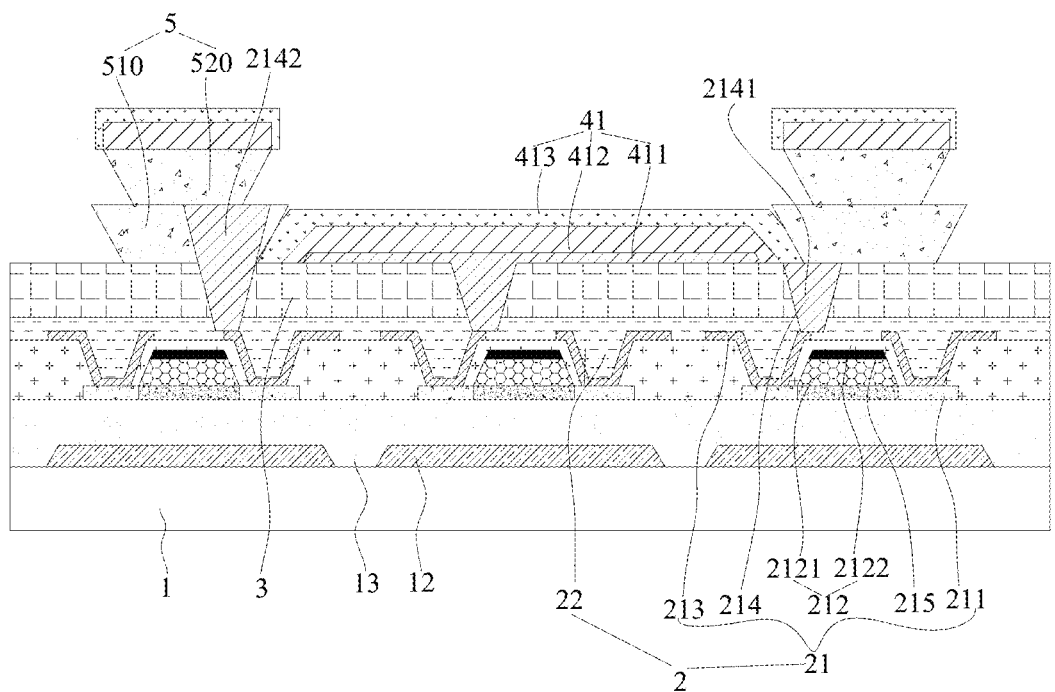
FIG. 25 is a schematic diagram of a second electrode layer of a first light emitting device according to a third implementation of the present disclosure.

As shown in FIG. 25, the second electrode layer 413 of the first light emitting device can be disposed on a surface of the light emitting functional layer 412 of the first light emitting device away from the driving backplane 2, and can be at least partially disposed in the first opening, and can at least partially cover the first lead 2141, so that the second electrode layer 413 of the first light emitting device can be coupled to the pixel driving circuit 21 through the first lead 2141, and then the second electrode layer 413 of the first light emitting device can be powered on through the pixel driving circuit 21. In the manufacturing process, the second electrode layer 413 of the first light emitting device can be automatically disconnected at the boundary of the second opening, avoiding the use of the fine mask and further reducing the manufacturing cost.

An orthographic projection of the second electrode layer 413 of the first light emitting device in the first opening at least partially overlaps with an orthographic projection of the light emitting functional layer 412 of the first light emitting device in the first opening, and the light emitting functional layer 412 of the first light emitting device and the second electrode layer 413 of the first light emitting device in a range of the first opening and the first electrode layer 411 of the first light emitting device exposed by the first opening may jointly constitute the first light emitting device.

Figure 26:
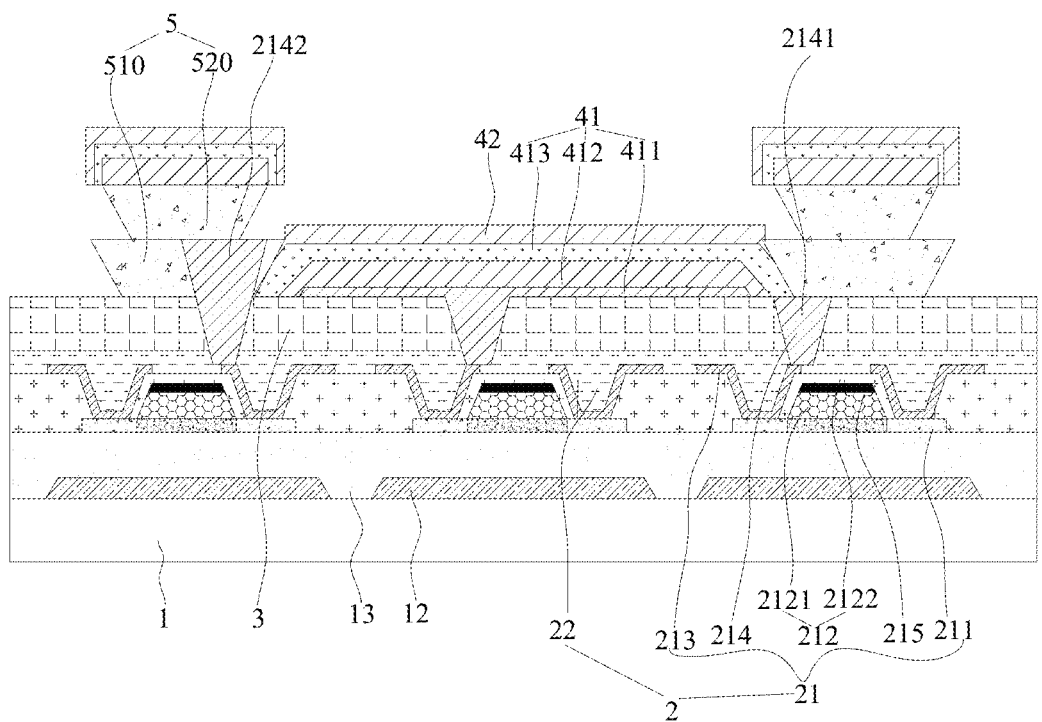
FIG. 26 is a schematic diagram of a light emitting functional layer of a second light emitting device according to a third implementation of the present disclosure.

The second light emitting device may share an electrode with the first light emitting device, for example, the first electrode layer of the second light emitting device may be the second electrode layer 413 of the first light emitting device. As shown in FIG. 26, the light emitting functional layer 42 of the second light emitting device covers a surface of the second electrode layer 413 of the first light emitting device away from the driving backplane 2, is continuously distributed in the first opening, and can fill a gap between the first electrode layer of the second light emitting device and the sidewall of the first opening. In the manufacturing process, the light emitting functional layer 42 of the second light emitting device can be disconnected at a boundary of the second opening, and in this process, since the orthographic projection of the top of the second opening on the first pixel definition layer 510 does not overlap with the second lead 2142, after the formed light emitting functional layer 42 of the second light emitting device is disconnected at the boundary of the second opening, the second lead 2142 is not covered, so that the second lead 2142 can be exposed.

Figure 27:
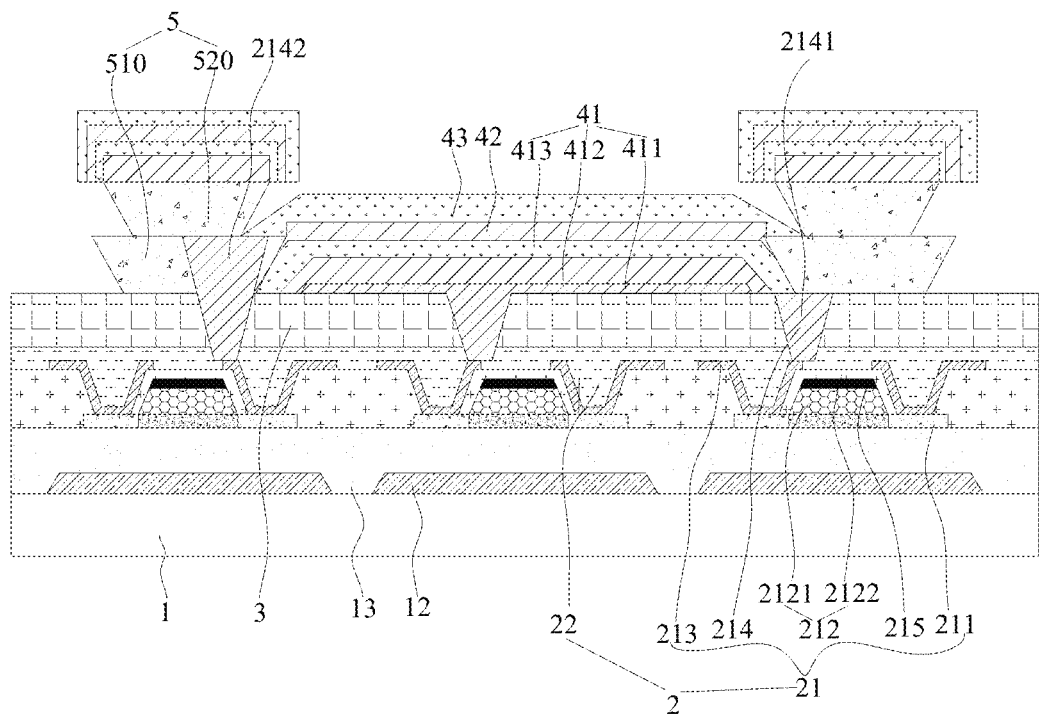
FIG. 27 is a schematic diagram of a second electrode layer of a second light emitting device according to a third implementation of the present disclosure.

As shown in FIG. 27, the second electrode layer 43 of the second light emitting device may at least partially cover a surface of the light emitting functional layer 42 of the second light emitting device away from the driving backplane 2, and may at least partially cover the second lead 2142, so that the second electrode layer 43 of the second light emitting device can be coupled to the pixel driving circuit 21 through the second lead 2142, and then the second electrode layer 43 of the second light emitting device can be powered on through the pixel driving circuit 21. In the manufacturing process, the second electrode layer 43 of the second light emitting device can be automatically disconnected at the boundary of the second opening, avoiding the use of the fine mask, which not only reduces the alignment accuracy requirements for the mask, but also reduces the manufacturing cost. The light emitting functional layer 42 of the second light emitting device, the second electrode layer 43 of the second light emitting device, and the first electrode layer of the second light emitting device may jointly constitute the second light emitting device. An orthographic projection of the second electrode layer 43 of the second light emitting device on the driving backplane 2 at least partially overlaps with an orthographic projection of the light emitting functional layer 412 of the first light emitting device on the driving backplane 2, so that the light emitted by the first light emitting device is superimposed with the light emitted by the second light emitting device, which can improve the utilization of the display panel and the display resolution.

The third light emitting device can share an electrode with the second light emitting device, for example, the first electrode layer of the third light emitting device is the second electrode layer 43 of the second light emitting device. The light emitting functional layer 44 of the third light emitting device is located on a side of the first electrode layer 43 of the third light emitting device away from the driving backplane 2, and its orthographic projection on the driving backplane 2 can cover an orthographic projection of the first electrode layer 43 of the third light emitting device on the driving backplane 2; in some embodiments, the light emitting functional layer 44 of the third light emitting device can at least cover a second opening region, and can fill a gap between the first electrode layer 43 of the third light emitting device and the sidewall of the second opening, thereby avoiding the contact and the short circuit between the second electrode layer 45 of the third light emitting device subsequently formed and the second electrode layer 43 of the second light emitting device.

The second electrode layer 45 of the third light emitting device can cover a surface of the light emitting functional layer 44 of the third light emitting device away from the driving backplane 2, and its orthographic projection on the driving backplane 2 can cover an orthographic projection of the light emitting functional layer 44 of the third light emitting device on the driving backplane 2. The second electrode layer 45 of the third light emitting device can be coupled to an external power source through a circuit on the periphery of the light emitting unit so as to be powered on.

The second electrode layer 43 of the second light emitting device, the light emitting functional layer 44 of the third light emitting device, and the second electrode layer 45 of the third light emitting device may jointly constitute the third light emitting device.

Formation processes for the light emitting unit in the embodiments of the present disclosure will be described in detail below.

Figure 28:
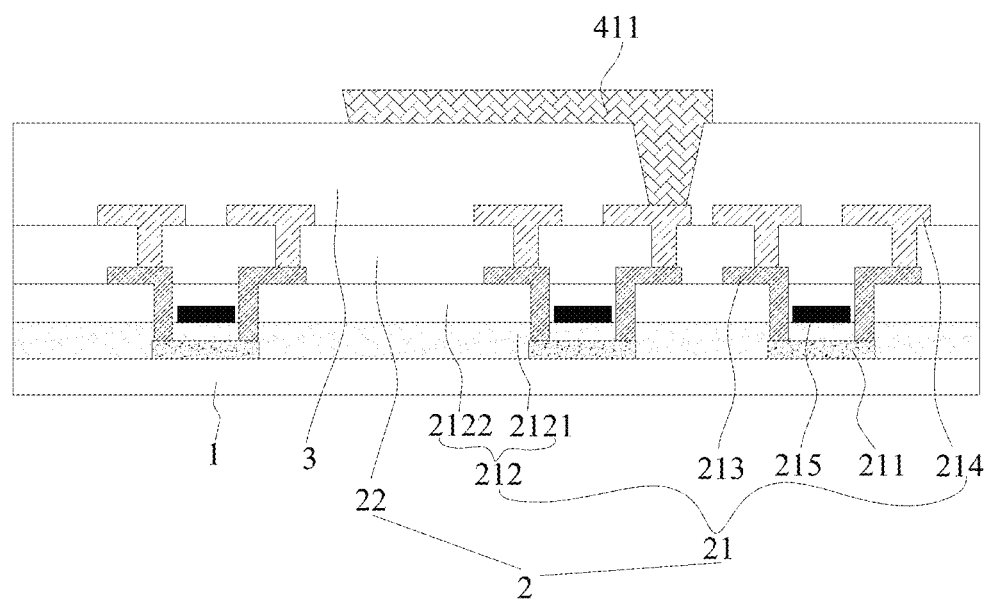
FIG. 28 is a schematic diagram of a first electrode layer according to an embodiment of the disclosure.

Multiple via holes which are respectively communicated with different pixel driving circuits 21 can be formed on the driving backplane 2 by the photolithography process, and individual via holes can be disposed at intervals. In some embodiments, when one light emitting unit includes three light emitting devices, at least three via holes may be formed in a region corresponding to one light emitting unit. First electrode layers 411 of multiple first light emitting devices distributed in array can be formed on the surface of the driving backplane 2 by a process such as the chemical vapor deposition, the physical vapor deposition, the vacuum evaporation, the magnetron sputtering, or the atomic layer deposition, and each first electrode layer 411 can be coupled to the pixel driving circuit 21 through the via hole, as shown in FIG. 28; and the pixel definition layer 5 can be subsequently formed on the surfaces of the driving backplane 2 and the first electrode layer 411 of each first light emitting device by using the process such as the chemical vapor deposition, the physical vapor deposition or the atomic layer deposition.

Specific details of the formation processes for the light emitting unit in various embodiments of the present disclosure will be described in detail below.

In the first implementation of the present disclosure, the photolithography process may be used to perform photolithography on the pixel definition layer 5 to form the opening 51 exposing the first electrode layer 411 of each first light emitting device, as shown in FIG. 10. A mask with a first mask pattern can be used for masking, the first mask pattern may be the same as a pattern of each opening 51 of the pixel definition layer 5, and then the light emitting functional layer 412 of the first light emitting device may be respectively formed in each opening 51, as shown in FIG. 11.

The photolithography can be performed on the pixel definition layer 5 and the planarization layer 3 to form the via hole 52 penetrating the pixel definition layer 5 and the planarization layer 3, and the via hole 52 can be coupled to one of the pixel driving circuits 21. A mask with a second mask pattern can be used for masking, an opening of the second mask pattern can be larger than an opening of the first mask pattern, and thus, the second electrode layer 413 of the first light emitting device covering the light emitting functional layer 412 of the first light emitting device and part of the pixel definition layer 5 can be formed according to the second mask pattern. In this process, the second electrode layer 413 of the first light emitting device can be coupled to one of the pixel driving circuits 21 through the via hole 52 penetrating the pixel definition layer 5 and the planarization layer 3, as shown in FIG. 12.

A mask with a third mask pattern can be used for masking, and an opening of the third mask pattern can be larger than the opening of the second mask pattern, and then the light emitting functional layer 42 of the second light emitting device can be formed according to the third mask pattern, as shown in FIG. 13.

A mask with a fourth mask pattern can be used for masking, and an opening of the fourth mask pattern can be larger than the opening of the third mask pattern, and then the second electrode layer 43 of the second light emitting device can be formed according to the fourth mask pattern. In this process, the second electrode layer 43 of the second light emitting device can be coupled to one of the pixel driving circuits 21 through the via hole 52 penetrating the pixel definition layer 5 and the planarization layer 3, as shown in FIG. 14.

In order to reduce the manufacturing cost, an open mask can be used for masking, and then the light emitting functional layer 44 of the third light emitting device and the second electrode layer 45 of the third light emitting device are sequentially formed on the surface of the second electrode layer 43 of the second light emitting device, as shown in FIG. 16. In this process, a mask with a fifth mask pattern may be used to form the light emitting material layer 441 of the third light emitting device, and the open mask may be used to form other film layers of the light emitting functional layer 44 of the third light emitting device and the second electrode layer 45 of the third light emitting device.

It should be noted that first electrode layers 411 of individual light emitting devices are respectively coupled to different pixel driving circuits 21 in the driving backplane 2 so as to respectively control, by means of a different pixel driving circuit 21, a light emitting device 41 corresponding to the pixel driving circuit 21 to emit the light.

In the second implementation of the present disclosure, as shown in FIG. 17, while the first electrode layer 411 of the first light emitting device is formed, the first lead 2141 and the second lead 2141 may be respectively formed in different via holes spaced apart from the first electrode layer 411 of the first light emitting device, and then the pixel driving circuits 21 in the driving backplane 2 can be electrically led out through the first lead 2141 and the second lead 2142.

In an embodiment, the pixel definition layer 5 may include the first pixel definition layer 510 and the second pixel definition layer 520. When the pixel definition layer 5 is formed, the first pixel definition layer 510 can be formed first. In some embodiments, the first pixel definition layer 510 can be formed on the surfaces of the driving backplane 2 and the first electrode layer 411 of each first light emitting device through the process such as the chemical vapor deposition, the physical vapor deposition or the atomic layer deposition, and then the first opening is formed in the first pixel definition layer 510 through the photolithography process. The first opening can expose the first electrode layer 411 of the first light emitting device, the first lead 2141 and the second lead 2142. In this process, the sidewall of the first opening can be shrunk along the direction away from the driving backplane 2 by controlling a photolithography rate. Subsequently, the second pixel definition layer 520 may be formed in the first opening, and a thickness of the second pixel definition layer 520 is smaller than that of the first pixel definition layer 510. In some embodiments, the second pixel definition layer 520 can be formed on in the first opening through the process such as the chemical vapor deposition, the physical vapor deposition or the atomic layer deposition, and then the second opening is formed in the second pixel definition layer 520 through the photolithography process. The second opening can expose the first electrode layer 411 of the first light emitting device, and can also at least partially expose the first lead 2141. In this process, the sidewall of the second opening can be shrunk along the direction away from the driving backplane 2 by controlling the photolithography rate.

In order to reduce the manufacturing cost, the open mask can be used for masking, and then the light emitting functional layer 412 of the first light emitting device, the second electrode layer 413 of the first light emitting device, the light emitting functional layer 42 of the second light emitting device, the second electrode layer 43 of the second light emitting device, the light emitting functional layer 44 of the third light emitting device and the second electrode layer 45 of the third light emitting device are sequentially formed on the surface of the first electrode layer 411 of the first light emitting device. In this process, different film layers are disconnected at corresponding positions through the arrangement of pixel definition layers with different thicknesses and the first opening and the second opening, avoiding the use of the fine mask, which not only reduces the alignment accuracy requirements for the mask, but also reduces the manufacturing cost.

In the third implementation of the present disclosure, the formation method of the first lead 2141 and the second lead 2142 is similar to the formation method of the first lead 2141 and the second lead 2142 in the second implementation of the present disclosure, and accordingly, it is not repeated here. It should be noted that the second lead 2142 may protrude from the surface of the driving backplane 2.

In an embodiment, as shown in FIG. 23, the pixel definition layer 5 may include the first pixel definition layer 510 and the second pixel definition layer 520. When the pixel definition layer 5 is formed, the first pixel definition layer 510 can be formed first. In some embodiments, the first pixel definition layer 510 can be formed on surfaces of the driving backplane 2, the second lead 2142 and the first electrode layer 411 of each first light emitting device through the process such as the chemical vapor deposition, the physical vapor deposition or the atomic layer deposition, and then the first opening is formed in the first pixel definition layer 510 through the photolithography process. The first opening can expose the first electrode layer 411 of the first light emitting device, and the first lead 2141; in addition, the second lead 2142 may be exposed on the surface of the first pixel definition layer 510 away from the driving backplane 2. In this process, the sidewall of the first opening can be shrunk along the direction away from the driving backplane 2 by controlling the photolithography rate. Subsequently, the second pixel definition layer 520 may be formed on a side of the first pixel definition layer 510 away from the driving backplane 2, and then the second opening may be formed in the second pixel definition layer 520 through the photolithography process. The second opening may expose the first opening, and can also at least partially expose the second lead 2142 located on the surface of the first pixel definition layer 510. In this process, the sidewall of the second opening can be shrunk along the direction away from the driving backplane 2 by controlling the photolithography rate.

In order to reduce the manufacturing cost, the open mask can be used for masking, and then the light emitting functional layer 412 of the first light emitting device, the second electrode layer 413 of the first light emitting device, the light emitting functional layer 42 of the second light emitting device, the second electrode layer 43 of the second light emitting device, the light emitting functional layer 44 of the third light emitting device and the second electrode layer 45 of the third light emitting device are sequentially formed on the surface of the first electrode layer 411 of the first light emitting device. In this process, different film layers are disconnected at corresponding positions through the arrangement of pixel definition layers with different thicknesses and the first opening and the second opening, avoiding the use of the fine mask, which not only reduces the alignment accuracy requirements for the mask, but also reduces the manufacturing cost.

In some embodiments of the present disclosure, the display panel may further include a second light shielding layer 6. As shown in FIG. 2, the second light shielding layer 6 may be disposed on a side of the light emitting device layer 4 away from the driving backplane 2, and has multiple light transmitting holes 61 distributed in an array. Each light transmitting hole 61 can be the via hole, and its shape can be a rectangle, a circle, an ellipse, or other shapes, which will not be listed here. The light transmitting holes 61 can be disposed in a one-to-one correspondence with individual openings in the pixel definition layer 5, and each light transmitting hole 61 at least partially overlaps with each opening in the pixel definition layer 5, and the overlapping region may be a region where all film layers in each light emitting unit overlap. The light emitted from the light emitting unit can exit from the light transmitting hole 61, and a light emitting area of each light emitting unit can be defined by the light transmitting hole 61.

In an embodiment, a material of the second light shielding layer 6 can be a metal or an organic material, which is not specifically limited herein. A light shielding film layer can be formed on the side of the light emitting device layer 4 away from the driving backplane 2 by using the vacuum evaporation, the magnetron sputtering, the chemical vapor deposition or the physical vapor deposition, and the photolithography process is used to form the light transmitting hole 61 in the light shielding film layer and then the second light shielding layer 6 is formed. In some embodiments, the light shielding film layer can be deposited on the side of the light emitting device layer 4 away from the driving backplane 2, and the photoresist can be formed on a side of the light shielding film layer away from the driving backplane 2. The mask is used to expose and develop the photoresist to form a developing region, and a pattern of the developing region can be the same as a pattern required by the second light shielding layer 6, and its size can be equal to a size of the light transmitting hole 61. The light shielding film layer can be anisotropically etched in the developing region to form the second light shielding layer 6, and finally the remaining photoresist on a surface of the second light shielding layer 6 can be stripped to expose the second light shielding layer 6 formed by photolithography.

In some embodiments of the present disclosure, the display panel may further include an encapsulation layer 7. As shown in FIG. 29, the encapsulation layer 7 may be located on the side of the light emitting device layer 4 away from the driving backplane 2, and may be used to block external water and oxygen and avoid the light emitting device layer 4 being corroded by the external water and oxygen, which can prolong the service life of the device. In some embodiments, the encapsulation layer 7 may be located between the light emitting device layer 4 and the second light shielding layer 6, or may be located on a side of the second light shielding layer 6 away from the light emitting device layer 4, which is not specifically limited herein.

The encapsulation layer 7 can be made of organic materials or inorganic materials, and can also be a composite film layer with alternating organic layers and inorganic layers. In some embodiments, a material of the encapsulation layer 7 can be an acrylic material, or a composite film layer composed of materials such as silicon nitride, silicon oxide or silicon oxynitride, which is not specifically limited here.

In an embodiment, the encapsulation layer 7 may be a composite film layer structure with alternating organic layers and inorganic layers. In some embodiments, the encapsulation layer 7 may include a first inorganic layer, an organic layer, and a second inorganic layer, the first inorganic layer may be formed on a surface of the light emitting device layer 4, the second inorganic layer is formed on a side of the first inorganic layer away from the light emitting device layer 4, and the organic layer is located between the first inorganic layer and the second inorganic layer. Water and oxygen can be blocked through the inorganic layers, and a stress of the inorganic layers can be released through the organic layer to prevent the peeling between the light emitting device layer 4 and the first inorganic layer due to the stress.

The embodiments of the present disclosure also provide a manufacturing method for a display panel. The display panel may be the display panel of any of the above-mentioned embodiments, and the structure of the display panel will not be described in detail here. As shown in FIG. 30, the manufacturing method may include step S110 to step S120.

In the step S110, the driving backplane including the multiple pixel driving circuits is formed; and in the step S120, the light emitting device layer is formed on a side of the driving backplane; the light emitting device layer includes the multiple light emitting units distributed in an array, and the light emitting unit includes the multiple light emitting devices stacked in the direction away from the driving backplane; light emitting devices other than the light emitting device closest to the driving backplane in the direction perpendicular to the driving backplane are transparent devices; and in the same light emitting unit, at least part of the light emitting devices are coupled to the pixel driving circuits for emitting light under driving of the pixel driving circuits, and at least two light emitting devices in the same light emitting unit have different light emitting materials.

The specific details and beneficial effects of the manufacturing method of the embodiments of the present disclosure have been described in the above embodiments of the display panel, and thus, the details are not repeated here.

It should be noted that although various steps of the manufacturing method for the display panel of the present disclosure are described in a particular order in the figures, this is not required or implied that these steps must be performed in this particular order, or all the steps shown must be performed to achieve the desired result. Additionally or alternatively, certain steps may be omitted, multiple steps may be combined into one step, and/or one step may be decomposed into multiple steps and so on.

The embodiments of the present disclosure also provide a display device, and the display device may include the display panel of any of the above-mentioned embodiments, and its structure and beneficial effects can refer to the above-mentioned embodiments of the display panel, which will not be described in detail here. The display device of the embodiments of the present disclosure may be a device for displaying an image, such as a mobile phone, a display screen, a tablet computer, a TV, a micro display device, etc., which will not be listed here.

The present disclosure also provides a pixel driving circuit, applied to the display panel in any of the above embodiments, and the display panel may be an AMOLED display panel, and the display panel may include the driving backplane and multiple light emitting units distributed on a side of the driving backplane in an array, each light emitting unit may include multiple light emitting devices connected in series between a first power terminal VDD and a second power terminal VSS to emit light. The display panel can be divided into a display region and a peripheral region located outside the display region.

The driving backplane may include a substrate and a driving circuit disposed on the substrate. The driving circuit may include a pixel driving circuit located in the display region and a peripheral circuit located in the peripheral region. The peripheral circuit is coupled to the pixel driving circuit, and includes a light emitting control circuit, a gate driving circuit, a source driving circuit and so on. The light emitting control circuit can be used to output a light emitting control signal to the pixel driving circuit, the gate driving circuit can be used to output a writing control signal to the pixel driving circuit, and the source driving circuit can be used to output a data signal to the pixel driving circuit. In addition, the driving circuit can also be used to output a first power signal to the first power terminal VDD of the pixel driving circuit, and to output a second power signal to the second power terminal VSS.

Each light emitting device may be an OLED light emitting element, that is, an organic light emitting diode, which may have a first terminal and a second terminal. The first terminal may be an anode, and the second terminal may be a cathode. The first terminal of the light emitting device can be coupled to the pixel driving circuit, and the second terminal is used to input the second power signal.

The light emitting control signal, the writing control signal, the data signal, the first power signal and the second power signal are inputted to the pixel driving circuit and the light emitting device by controlling the peripheral circuit to make the light emitting device emit light to display the image.

Figure 31:
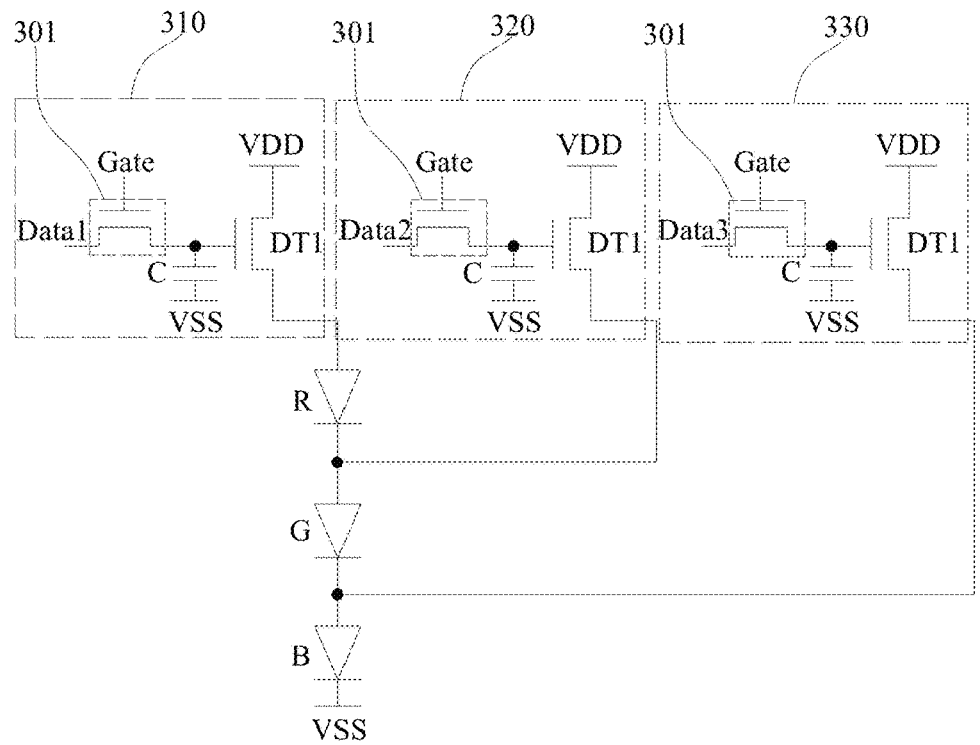
FIG. 31 is a schematic diagram of a pixel driving circuit according to a first implementation of the present disclosure.

As shown in FIG. 31, in the first implementation of the present disclosure, the pixel driving circuit includes multiple driving units, and each driving unit may include a driving transistor, a data writing unit 301, and an energy storage unit C.

The driving transistor has a control terminal, a first terminal and a second terminal, and the second terminal of the driving transistor is configured to be coupled to the first terminal of the light emitting device.

The data writing unit 301 is configured to be turned on in response to the writing control signal to transmit the data signal to the control terminal of the driving transistor.

A first terminal of the energy storage unit C is coupled to the first power terminal VDD, and a second terminal of the energy storage unit C is coupled to the control terminal of the driving transistor.

A first terminal of each light emitting device is coupled to a second terminal of a driving transistor of one of the driving units.

It should be noted that there may be three driving units, which are respectively a first driving unit 310, a second driving unit 320 and a third driving unit 330. A transistor of the first driving unit 310 is a first driving transistor DT1, a transistor of the second driving unit 320 is a second driving transistor DT2, and a transistor of the third driving unit 330 is a third driving transistor DT3.

There may also be three light emitting devices, which are respectively a first light emitting device, a second light emitting device, and a third light emitting device. In the embodiments of the present disclosure, the light emitted by the first light emitting device may be red (R), the light emitted by the second light emitting device may be green (G), and the light emitted by the third light emitting device may be blue (B).

A second terminal of the first driving transistor DT1 is coupled to the first light emitting device (R);

a second terminal of the second driving transistor DT2 is coupled between the first light emitting device (R) and the second light emitting device (G);

a second terminal of the third driving transistor DT3 is coupled between the second light emitting device (G) and the third light emitting device (B), and a second terminal of the third light emitting device (B) is coupled to the second power terminal VSS and is used to input the second power signal.

Figure 32:
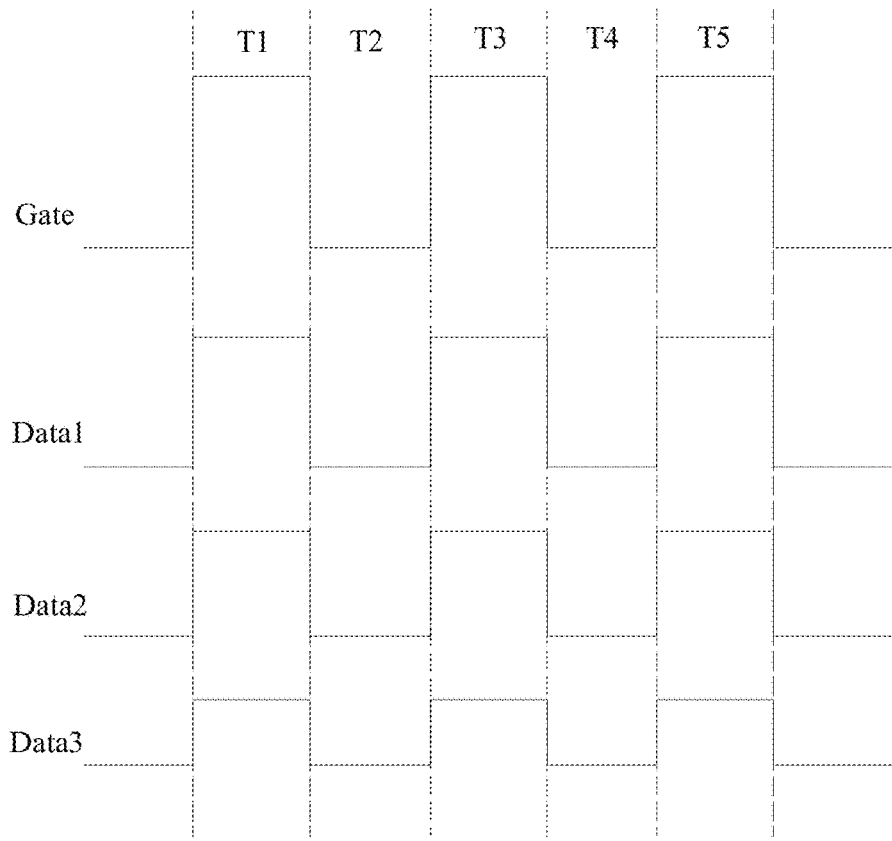
FIG. 32 is a timing diagram of an operating principle of a pixel driving circuit according to a first implementation of the present disclosure.

As shown in FIGS. 31 and 32, an operating process of the pixel driving circuit of the first implementation of the present disclosure is as follows:

in a data writing stage, the data writing unit 301 of each driving unit is turned on to transmit the data signal to the control terminal of the driving transistor through the data writing unit 301 and the driving transistor, and to charge the energy storage unit C, so that the multiple light emitting devices simultaneously emit light; and in a light emitting stage, the first power signal is respectively input to the first driving transistor DT1, the second driving transistor DT2 and the third driving transistor DT3 through the energy storage units C of respective driving units to respectively turn on the first driving transistor DT1, the second driving transistor DT2 and the third driving transistor DT3, so that a signal of a second terminal of the first driving transistor DT1 is transmitted to a first terminal of the first light emitting device (R), a signal of a second terminal of the second driving transistor DT2 is transmitted to a first terminal of the second light emitting device (G), and a signal of a second terminal of the third driving transistor DT3 is transmitted to a first terminal of the third light emitting device (B), thereby driving the first light emitting device (R), the second light emitting device (G) and the third light emitting device (B) to emit light simultaneously.

In the above process, as shown in FIG. 32, T1 to T5 are continuous stages, in the T1 stage, a data signal Gate, the first power signal Data1 input to the first driving transistor, the first power signal Data2 input to the second driving transistor and the first power signal Data3 input to the third driving transistor are all at a high level; in the T2 stage, the data signal Gate, the first power signal Data1 input to the first driving transistor, the first power signal Data2 input to the second driving transistor, and the first power signal Data3 input to the third driving transistor are all at the low level; in the T3 stage, the data signal Gate, the first power signal Data1 input to the first driving transistor, the first power signal Data2 input to the second driving transistor and the first power signal Data3 input to the third driving transistor are all at the high level; in the T4 stage, the data signal Gate, the first power signal Data1 input to the first driving transistor, the first power signal Data2 input to the second driving transistor, and the first power signal Data3 input to the third driving transistor are all at the low level; in the T5 stage, the data signal Gate, the first power signal Data1 input to the first driving transistor, the first power signal Data2 input to the second driving transistor and the first power signal Data3 input to the third driving transistor are all at the high level. A voltage through the third light emitting device (B) is Data3, a voltage through the second light emitting device (G) is Data2-Data3, and a voltage through the first light emitting device (R) is Data1-Data2, where Data1 is greater than Data2 and greater than Data3. The specific numerical values of Data1, Data2 and Data3 are controlled according to the luminous intensity required by each light emitting device. Therefore, in the T1 stage, T3 stage and T5 stage, the three light emitting devices of RGB can emit the light at the same time.

Figure 33:
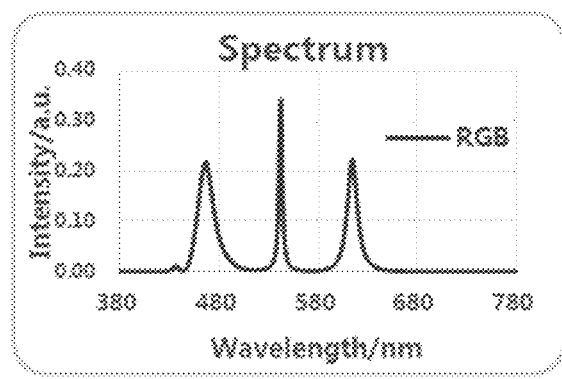
FIG. 33 is a RGB spectrum of a pixel driving circuit according to a first implementation of the present disclosure.

When the three light emitting devices of RGB emit light at the same time, a voltage value across each light emitting device can be adjusted to obtain a spectrum of any color. The obtained spectrum is shown in FIG. 33, where the abscissa is the wavelength and the ordinate is the intensity.

Figure 34:
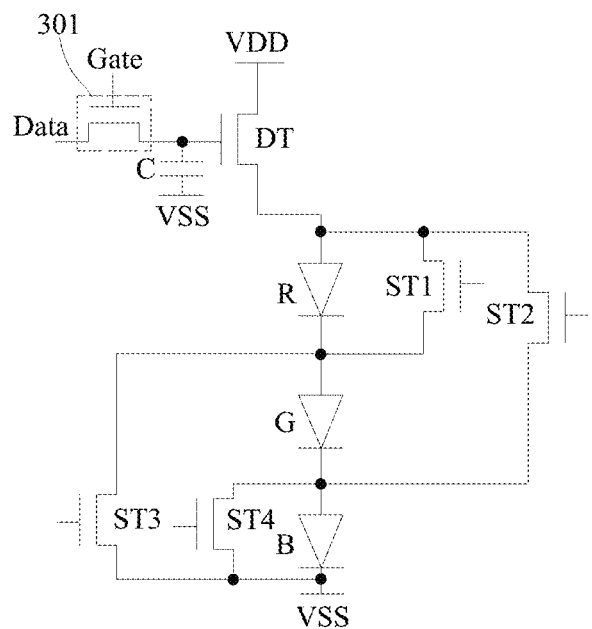
FIG. 34 is a schematic diagram of a pixel driving circuit according to a second implementation of the present disclosure.

As shown in FIG. 34, in the second implementation of the present disclosure, the pixel driving circuit is configured to drive multiple light emitting devices connected in series between the first power terminal VDD and the second power terminal VSS to emit light, the multiple light emitting devices may include a first light emitting device (R), a second light emitting device (G), and a third light emitting device (B), and the pixel driving circuit includes a driving transistor DT, a data writing unit 301, an energy storage unit C, a first switching unit ST1, a second switching unit ST2, a third switching unit ST3 and a fourth switching unit ST4.

The driving transistor DT has a control terminal, a first terminal and a second terminal, and the second terminal of the driving transistor DT is configured to be coupled to a first terminal of the first light emitting device (R);
   the data writing unit 301 is configured to be turned on in response to a writing control signal to transmit a data signal to the control terminal of the driving transistor DT;
   a first terminal of the energy storage unit C is coupled to the first power terminal VDD, and a second terminal of the energy storage unit C is coupled to the control terminal of the driving transistor DT;
   the first switching unit ST1 is configured to be turned on in response to the light emitting control signal, a first terminal of the first switching unit ST1 is coupled between the driving transistor DT and the first light emitting device (R), and a second terminal of the first switching unit ST1 is coupled between the first light emitting device (R) and the second light emitting device (G);
   the second switching unit ST2 is configured to be turned on in response to the light emitting control signal, a first terminal of the second switching unit ST2 is coupled between the driving transistor DT and the first light emitting device (R), and a second terminal of the second switching unit ST2 is coupled between the second light emitting device (G) and the third light emitting device (B);
   the third switching unit ST3 is configured to be turned on in response to the light emitting control signal, a first terminal of the third switching unit ST3 is coupled between the first light emitting device (R) and the second light emitting device (G), and a second terminal of the third switching unit ST3 is coupled to the second power terminal VSS;
   the fourth switching unit ST4 is configured to be turned on in response to the light emitting control signal, a first terminal of the fourth switching unit ST4 is coupled between the second light emitting device (G) and the third light emitting device (B), and a second terminal of the fourth switching unit ST4 is coupled to the second power terminal VSS.

Figure 35:
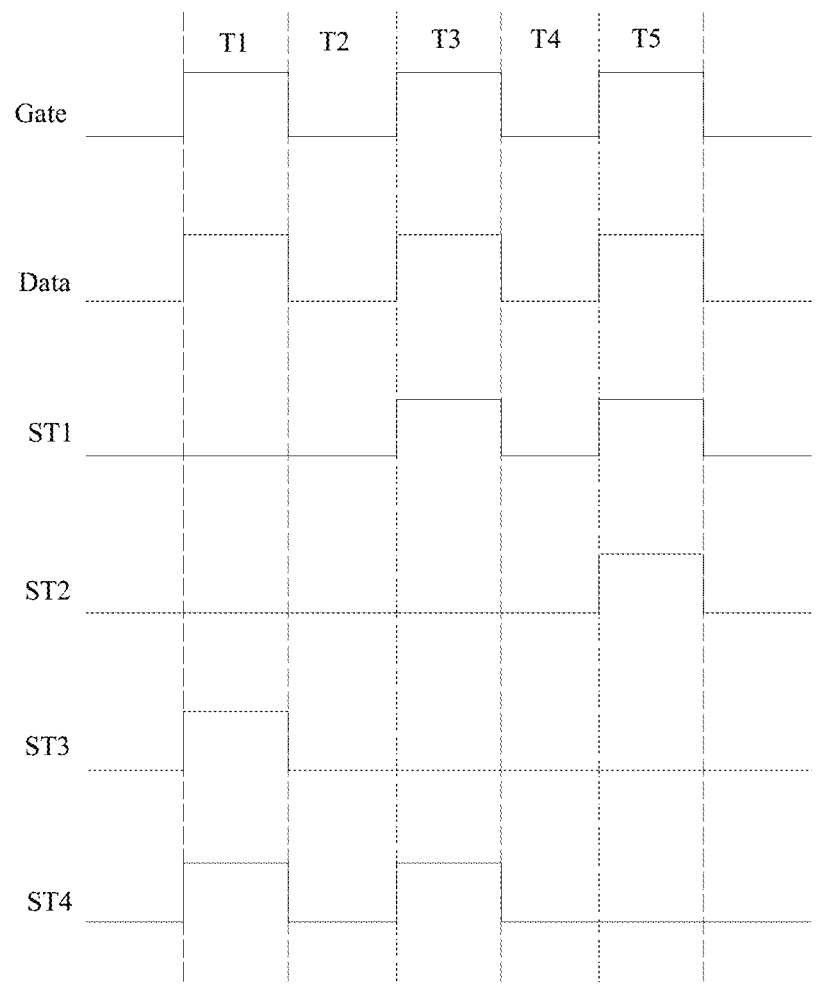
FIG. 35 is a timing diagram of an operating principle of a pixel driving circuit according to a second implementation of the present disclosure.

As shown in FIG. 34 and FIG. 35, an operating process of the pixel driving circuit of the second implementation of the present disclosure is as follows:
   in the data writing stage, the data writing unit 301 is turned on to transmit the data signal to the control terminal of the driving transistor DT through the data writing unit 301 and the driving transistor DT, and to charge the energy storage unit C; and
   in the light emitting stage, the first power signal is input to the driving transistor DT through the energy storage unit C to turn on the driving transistor DT, so that the signal of the second terminal of the driving transistor DT is transmitted to the first terminal of the first light emitting device (R); the first switching unit ST1 and the second switching unit ST2 are turned off, and the third switching unit ST3 and the fourth switching unit ST4 are turned on, so that the first light emitting device (R) emits light; or, the first switching unit ST1 and the fourth switching unit ST4 are turned on, and the second switching unit ST2 and the third switching unit ST3 are turned off, so that the second light emitting device (G) emits light; or the first switching unit ST1 and the second switching unit ST2 are turned on, and the third switching unit ST3 and the fourth switching unit ST4 are turned off, so that the third light emitting device (B) emits light.

In the above process, as shown in FIG. 35, T1 to T5 are continuous stages, in the T1 stage, the data signal Gate and the first power signal Data are both at the high level, the first switching unit ST1 and the second switching unit ST2 are turned off, and the third switching unit ST3 and the fourth switching unit ST4 are turned on; in the T2 stage, the data signal Gate and the first power signal Data are both at the low level, the first switching unit ST1, the second switching unit ST2, the third switching unit ST3 and the fourth switching unit ST4 are all turned off; in the stage T3, the data signal Gate and the first power signal Data are both at the high level, the second switching unit ST2 and the third switching unit ST3 are turned off, and the first switching unit ST1 and the fourth switching unit ST4 are turned on; in the T4 stage, the data signal Gate and the first power signal Data are both at the low level, the first switching unit ST1, the second switching unit ST2, the third switching unit ST3 and the four switching units ST4 are all turned off; and in the stage T5, the data signal Gate and the first power signal Data are both at the high level, the first switching unit ST1 and the second switching unit ST2 are turned on, and the third switching unit ST3 and the fourth switching unit ST4 are turned off. Therefore, in the T1 stage, R displays, in the T3 stage, G displays, in the T5 stage, B displays, thereby realizing the RGB time-sharing display.

Figure 36:
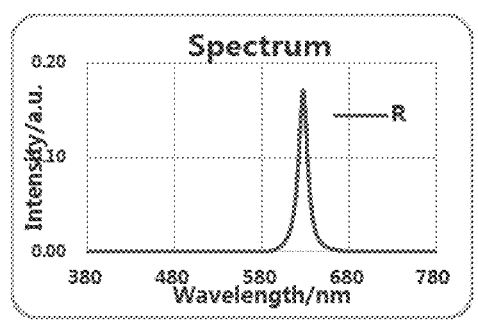
FIG. 36 is a spectrum of a first light emitting device (R) according to an embodiment of the disclosure.
Figure 37:
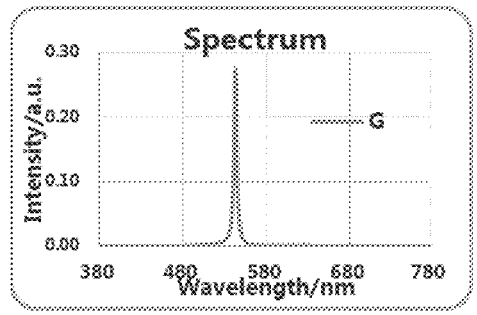
FIG. 37 is a spectrum of a first light emitting device (G) according to an embodiment of the disclosure.
Figure 38:
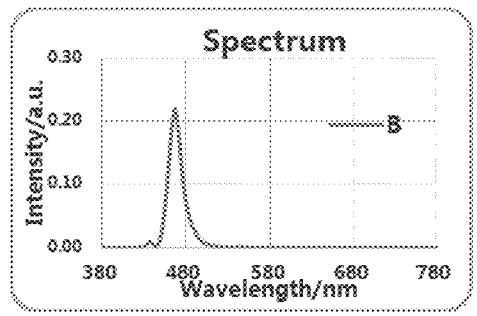
FIG. 38 is a spectrum of a first light emitting device (B) according to an embodiment of the disclosure.

When the three light emitting devices of RGB emit light in a time-sharing manner, a spectrum of the first light emitting device (R) is shown in FIG. 36, a spectrum of the second light emitting device (G) is shown in FIG. 37, and a spectrum of the third light emitting device (B) is shown in FIG. 38, and in FIGS. 36-38, the abscissa is wavelength, and the ordinate is intensity. After calculation, when the three light emitting devices of RGB emit the light in the time-sharing manner, the color gamut is larger than NTSC 117%.

Figure 39:
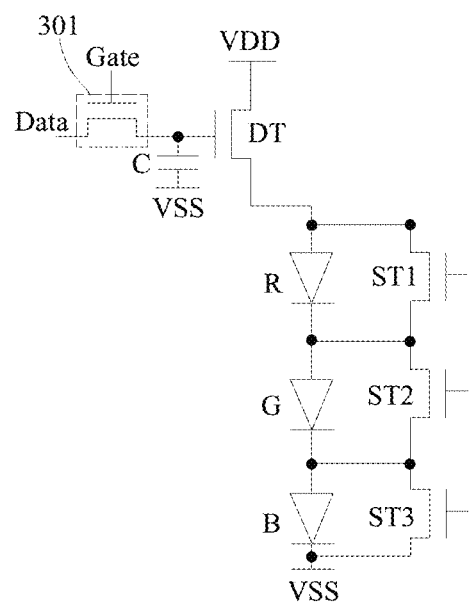
FIG. 39 is a schematic diagram of a pixel driving circuit according to a third implementation of the present disclosure.

As shown in FIG. 39, in the third implementation of the present disclosure, the pixel driving circuit is configured to drive multiple light emitting devices connected in series between the first power terminal VDD and the second power terminal VSS to emit light, the multiple light emitting devices may include a first light emitting device (R), a second light emitting device (G), and a third light emitting device (B), and the pixel driving circuit includes a driving transistor DT, a data writing unit 301, an energy storage unit C, a first switching unit ST1, a second switching unit ST2, and a third switching unit ST3.

The driving transistor DT has a control terminal, a first terminal and a second terminal, and the second terminal of the driving transistor DT is configured to be coupled to a first terminal of the first light emitting device (R);

the data writing unit 301 is configured to be turned on in response to a writing control signal to transmit a data signal to the control terminal of the driving transistor DT;

a first terminal of the energy storage unit C is coupled to the first power terminal VDD, and a second terminal of the energy storage unit C is coupled to the control terminal of the driving transistor DT;

the first switching unit ST1 is configured to be turned on in response to a light emitting control signal, a first terminal of the first switching unit ST1 is coupled between the driving transistor DT and the first light emitting device (R), and a second terminal of the first switching unit ST1 is coupled between the first light emitting device (R) and the second light emitting device (G);

the second switching unit ST2 is configured to be turned on in response to the light emitting control signal, a first terminal of the second switching unit ST2 is coupled between the first light emitting device (R) and the second light emitting device (G), and a second terminal of the second switching unit ST2 is coupled between the second light emitting device (G) and the third light emitting device (B);

the third switching unit ST3 is configured to be turned on in response to the light emitting control signal, a first terminal of the third switching unit ST3 is coupled between the second light emitting device (G) and the third light emitting device (B), and a second terminal of the third switching unit ST3 is coupled to the second power terminal VSS.

Figure 40:
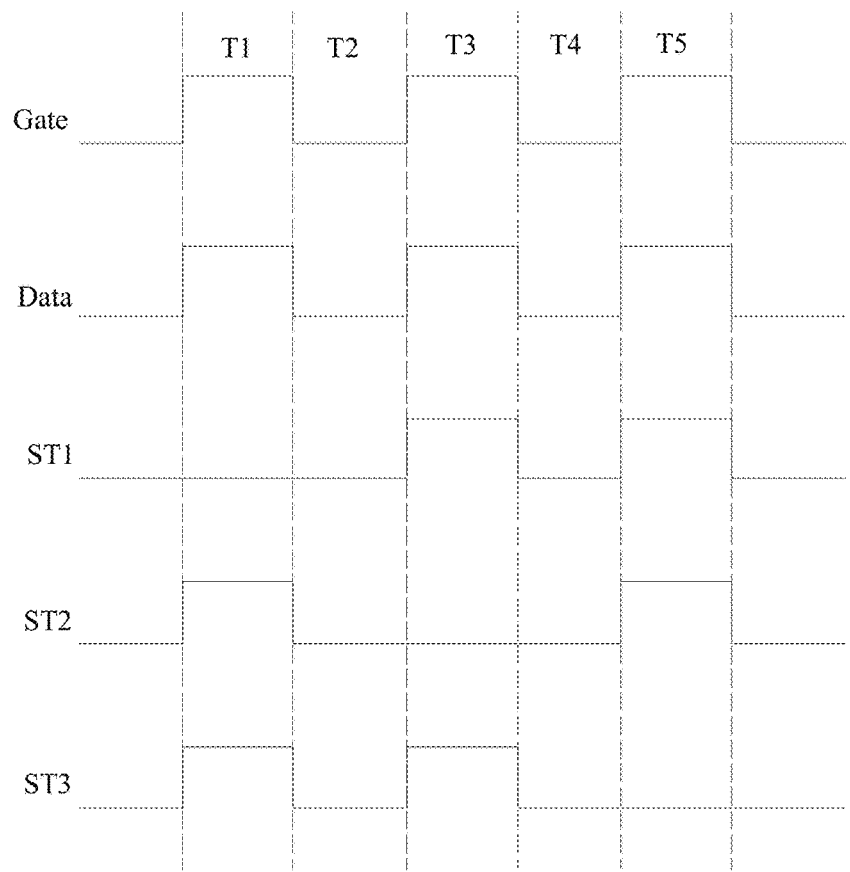
FIG. 40 is a timing diagram of an operation principle of a pixel driving circuit according to a third implementation of the present disclosure.

As shown in FIG. 39 and FIG. 40, an operating process of the pixel driving circuit of the second implementation of the present disclosure is as follows:

in the data writing stage, the data writing unit 301 is turned on to transmit the data signal to the control terminal of the driving transistor DT through the data writing unit 301 and the driving transistor DT, and to charge the energy storage unit C; and in the light emitting stage, the first power signal is input to the driving transistor DT through the energy storage unit C to turn on the driving transistor DT, so that the signal of the second terminal of the driving transistor DT is transmitted to the first terminal of the first light emitting device (R); the first switching unit ST1 is turned off, and the second switching unit ST2 and the third switching unit ST3 are turned on, so that the first light emitting device (R) emits light; or, the second switching unit ST2 is turned off, and the first switching unit ST1 and the third switching unit ST3 are turned on, so that the second light emitting device (G) emits light; or, the third switching unit ST3 is turned off, and the first switching unit ST1 and the second switching unit ST2 are turned on, so that the third light emitting device (B) emits light.

In the above-mentioned process, as shown in FIG. 40, T1 to T5 are continuous stages, in the T1 stage, the data signal Gate and the first power signal Data are both at the high level, the first switching unit is turned off, the second switching unit and the third switching unit are turned on; in the T2 stage, the data signal Gate and the first power signal Data are both at the low level, and the first switching unit, the second switching unit and the third switching unit are all turned off; in the T3 stage, the data signal Gate and the first power signal Data are both at the high level, the first switching unit and the third switching unit are turned on, and the second switching unit is turned off; in the T4 stage, the data signal Gate and the first power signal Data are both at the low level, the first switching unit, the second switching unit and the third switching unit are all turned off; and in the T5 stage, the data signal Gate and the first power signal Data are both at the high level, the first switching unit and the second switching unit are turned on, and the third switching unit is turned off. Therefore, in the T1 stage, R displays, in the T3 stage, G displays, in the T5 stage, B displays, thereby realizing the RGB time-sharing display.

Figure 41:
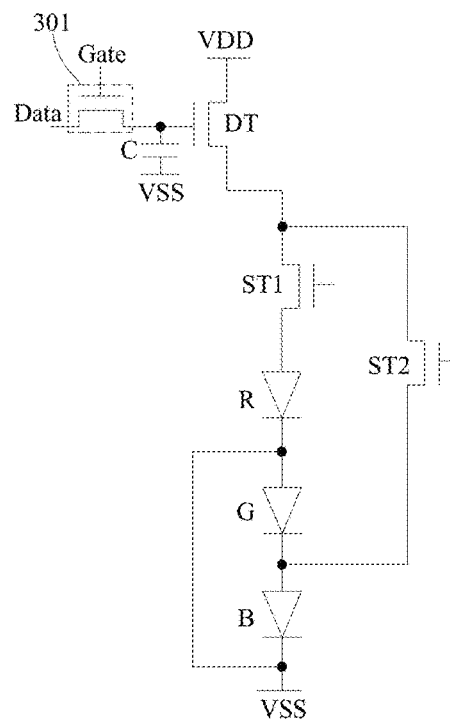
FIG. 41 is a schematic diagram of a pixel driving circuit according to a fourth implementation of the present disclosure.

As shown in FIG. 41, in the fourth implementation of the present disclosure, the pixel driving circuit is configured to drive multiple light emitting devices connected in series between the first power terminal VDD and the second power terminal VSS to emit light, the multiple light emitting devices may include a first light emitting device (R), a second light emitting device (G), and a third light emitting device (B), and the pixel driving circuit includes a driving transistor DT, a data writing unit 301, an energy storage unit C, a first switching unit ST1, a second switching unit ST2 and a connecting wire.

The driving transistor DT has a control terminal, a first terminal and a second terminal, and the second terminal of the driving transistor DT is configured to be coupled to a first terminal of the first light emitting device (R);

the data writing unit 301 is configured to be turned on in response to a writing control signal to transmit a data signal to the control terminal of the driving transistor DT;

a first terminal of the energy storage unit C is coupled to the first power terminal VDD, and a second terminal of the energy storage unit C is coupled to the control terminal of the driving transistor DT;

the first switching unit ST1 is configured to be turned on in response to the light emitting control signal, and the first switching unit ST1 is coupled between the second terminal of the driving transistor DT and the first light emitting device (R);

the second switching unit ST2 is configured to be turned on in response to the light emitting control signal, a first terminal of the second switching unit ST2 is coupled between the driving transistor DT and the first light emitting device (R), and a second terminal of the second switching unit ST2 is coupled between the second light emitting device (G) and the third light emitting device (B); and one end of the connecting wire is coupled between the first light emitting device (R) and the second light emitting device (G), and the other end is coupled to the second power terminal VSS.

As shown in FIG. 41 and FIG. 42, an operating process of the pixel driving circuit of the second implementation of the present disclosure is as follows:

in the data writing stage, the data writing unit 301 is turned on to transmit the data signal to the control terminal of the driving transistor DT through the data writing unit 301 and the driving transistor DT, and to charge the energy storage unit C; and in the light emitting stage, the first power signal is input to the driving transistor DT through the energy storage unit C to turn on the driving transistor DT, so that the signal of the second terminal of the driving transistor DT is transmitted to the first terminal of the first light emitting device (R); the second switching unit ST2 is turned off, and the first switching unit ST1 is turned on, so that the first light emitting device (R) emits light; or, the first switching unit ST1 is turned off, and the second switching unit ST2 is turned on, when a voltage value of the first power signal is smaller than a voltage value of the second power signal, the second light emitting device (G) emits light; or the first switching unit ST1 is turned off, and the second switching unit ST2 is turned on, and when the voltage value of the first power signal is greater than the voltage value of the second power signal, the third light emitting device (B) emits light.

In the above process, as shown in FIG. 42, when a first power signal Data is a positive voltage, the first light emitting device (R) and the third light emitting device (B) are controlled to display, and when the first power signal Data is a negative voltage, the second light emitting device (B) is controlled to display. Specifically, T1 to T5 are continuous stages, in the T1 stage, the data signal Gate is at the high level, the first power signal Data is the positive voltage, the first switching unit ST1 is turned on, the second switching unit ST2 is turned off, and the first power signal Data is transmitted to the first terminal of the first light emitting device (R), the second power signal is transmitted to the second terminal of the first light emitting device (R) through the connecting wire, and then a voltage difference is formed across the first light emitting device (R) to make the first light emitting device (R) emit light; in the T2 stage, the data signal Gate and the first power signal Data are both at the low level, and the first switching unit ST1 and the second switching unit ST2 are both turned off; in the T3 stage, the data signal Gate is at the high level, the first power signal Data is the negative voltage, the first switching unit ST1 is turned off, the second switching unit ST2 is turned on, and the first power signal Data is transmitted to the second terminal of the second light emitting device (G), and the second power signal is transmitted to the first terminal of the second light emitting device (G) through the connecting wire, and then a voltage difference is formed across the second light emitting device (G) to make the second light emitting device (G) emit light; in the T4 stage, the data signal Gate and the first power signal Data are both at the low level, and the first switching unit ST1 and the second switching unit ST2 are both turned off; in the stage T5, the data signal Gate and the first power signal Data are both at the high level, the first switching unit ST1 is turned off, the second switching unit ST2 is turned on, and the first power signal Data is transmitted to the first terminal of the third light emitting device (B), the second power signal is transmitted to the second terminal of the third light emitting device (B), and then a voltage difference is formed across the third light emitting device (B) to make the third light emitting device (B) emits light. Therefore, in the T1 stage, R displays, in the T3 stage, G displays, and in the T5 stage, B displays, thereby realizing the RGB time-sharing display.

The present disclosure also provides a driving method for a pixel driving circuit. The pixel driving circuit is the pixel driving circuit of any of the above-mentioned embodiments, and its structure is not described in detail here.

For the pixel driving circuit in the first implementation of the present disclosure, the driving method of the present disclosure may include:
 in a data writing stage, turning on the data writing unit of each driving unit to transmit the data signal to the control terminal of the driving transistor through the data writing unit and the driving transistor, and to charge the energy storage unit, so that the multiple light emitting devices emit light simultaneously.

As shown in FIG. 43, for the pixel driving circuit in the second implementation of the present disclosure, the driving method of the present disclosure may include step S310 to step S320, in which:
 in the step S310, in the data writing stage, the data writing unit is turned on to transmit the data signal to the control terminal of the driving transistor through the data writing unit and the driving transistor, and to charge the energy storage unit; and
 in the step S320, in the light emitting stage, the first power signal is input to the driving transistor through the energy storage unit to turn on the driving transistor, so that the signal of the second terminal of the driving transistor is transmitted to the first terminal of the first light emitting device; the first switching unit and the second switching unit are turned off, and the third switching unit and the fourth switching unit are turned on, so that the first light emitting device emits light; or, the first switching unit and the fourth switching unit are turned on, and the second switching unit and the third switching unit are turned off, so that the second light emitting device emits light; or the first switching unit and the second switching unit are turned on, and the third switching unit and the fourth switching unit are turned off, so that the third light emitting device emits light.

Figure 44:
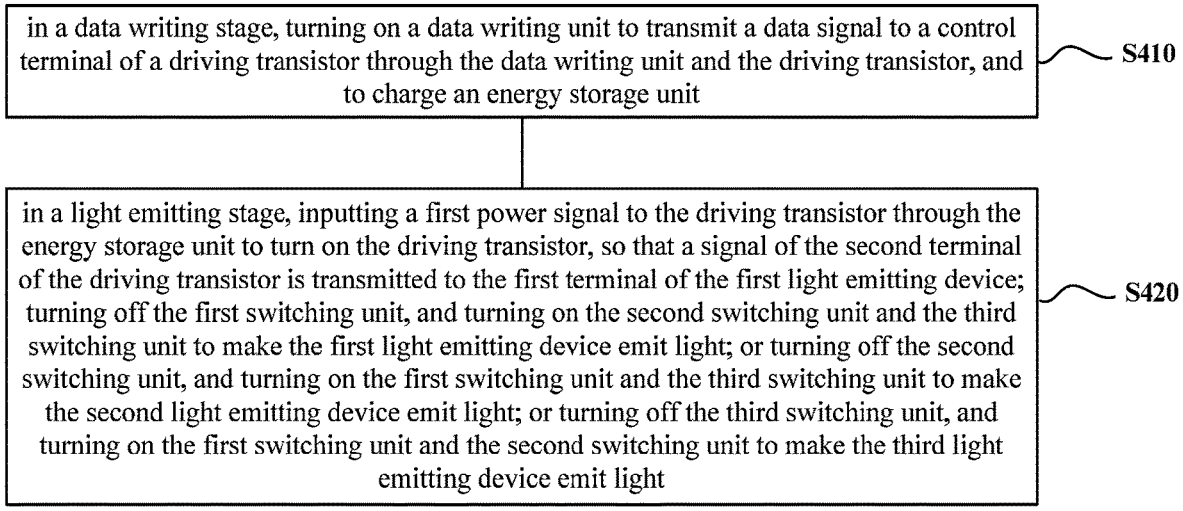
FIG. 44 is a flowchart of an embodiment of a driving method for a pixel driving circuit according to the present disclosure.

As shown in FIG. 44, for the pixel driving circuit in the third implementation of the present disclosure, the driving method of the present disclosure may include step S410 to step S420, wherein:
 in the step S410, in the data writing stage, the data writing unit is turned on to transmit the data signal to the control terminal of the driving transistor through the data writing unit and the driving transistor, and to charge the energy storage unit; and
 in the step S420, in the light emitting stage, the first power signal is input to the driving transistor through the energy storage unit to turn on the driving transistor, so that the signal of the second terminal of the driving transistor is transmitted to the first terminal of the first light emitting device; the first switching unit is turned off, and the second switching unit and the third switching unit are turned on, so that the first light emitting device emits light; or, the second switching unit is turned off, and the first switching unit and the third switching unit are turned on, so that the second light emitting device emits light; or, the third switching unit is turned off, and the first switching unit and the second switching unit are turned on, so that the third light emitting device emits light.

Figure 45:
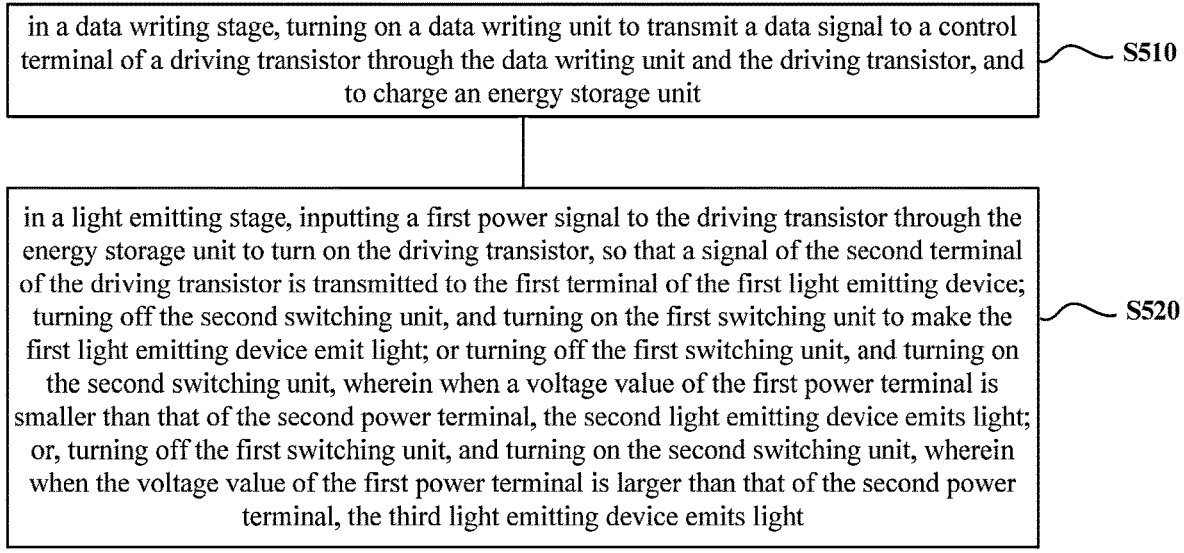
FIG. 45 is a flowchart of an embodiment of a driving method for a pixel driving circuit according to the present disclosure.

As shown in FIG. 45, for the pixel driving circuit in the fourth implementation of the present disclosure, the driving method of the present disclosure may include step S510 to step S520, in which:
 in the step S510, in the data writing stage, the data writing unit is turned on to transmit the data signal to the control terminal of the driving transistor through the data writing unit and the driving transistor, and to charge the energy storage unit; and
 in the step S520, in the light emitting stage, the first power signal is input to the driving transistor through the energy storage unit to turn on the driving transistor, so that the signal of the second terminal of the driving transistor is transmitted to the first terminal of the first light emitting device; the second switching unit is turned off, and the first switching unit is turned on, so that the first light emitting device emits light; or, the first switching unit is turned off, and the second switching unit is turned on, when a voltage value of the first power terminal is smaller than a voltage value of the second power terminal, the second light emitting device emits light; or the first switching unit is turned off, the second switching unit is turned on, and when the voltage value of the first power terminal is greater than the voltage value of the second power terminal, the third light emitting device emits light.

The details and beneficial effects of the above-mentioned driving method have been described in the above embodiments of the pixel driving circuit. For details, reference may be made to the structure and operating process of the pixel driving circuit, which will not be repeated here.

It should be noted that although various steps of the manufacturing method for the display panel of the present disclosure are described in a particular order in the figures, this is not required or implied that these steps must be performed in this particular order, or all the steps shown must be performed to achieve the desired result. Additionally or alternatively, certain steps may be omitted, multiple steps may be combined into one step, and/or one step may be decomposed into multiple steps and so on.

Other embodiments of the present disclosure will be apparent to those skilled in the art from consideration of the specification and practice of the present disclosure disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative.

What is claimed is:

1. A display panel, comprising:
    a driving backplane, comprising multiple pixel driving circuits; and
    a light emitting device layer, comprising multiple light emitting units distributed in an array, wherein each light emitting unit comprises multiple light emitting devices stacked in a direction away from the driving backplane, and light emitting devices other than a light emitting device closest to the driving backplane in a direction perpendicular to the driving backplane are transparent devices; and
    wherein in the same light emitting unit, at least part of the light emitting devices are coupled to the pixel driving circuits, to emit light when driven by the pixel driving circuits, and at least two light emitting devices in the same light emitting unit have different light emitting materials,
    wherein the number of light emitting devices in the same light emitting unit is three, comprising a first light emitting device, a second light emitting device and a third light emitting device distributed in the direction away from the driving backplane,
    wherein a first electrode layer of the first light emitting device is disposed on the side of the driving backplane, and the display panel further comprises:
    a pixel definition layer, disposed on the same side of the driving backplane as the first electrode layer of the first light emitting device, wherein the pixel definition layer is provided with multiple openings exposing the first electrode layer of each first light emitting device; and
    wherein a light emitting functional layer of the first light emitting device is at least partially disposed in the opening;
    a second electrode layer of the first light emitting device is disposed on a surface of the pixel definition layer away from the driving backplane, an orthographic projection of the second electrode layer of the first light emitting device in the opening and an orthographic projection of the light emitting functional layer of the first light emitting device in the opening are at least partially overlapped, and the second electrode layer of the first light emitting device is coupled to the pixel driving circuit through a via hole penetrating the pixel definition layer;
    a surface of the second electrode layer of the first light emitting device away from the driving backplane is covered by a light emitting functional layer of the second light emitting device, and an orthographic projection of the second electrode layer of the first light emitting device on the driving backplane is covered by an orthographic projection of the light emitting functional layer of the second light emitting device on the driving backplane;
    surfaces of the light emitting functional layer of the second light emitting device and the pixel definition layer are covered by a second electrode layer of the second light emitting device, an orthographic projection of the second electrode layer of the second light emitting device in the opening and the orthographic projection of the light emitting functional layer of the first light emitting device in the opening are at least partially overlapped, and the second electrode layer of the second light emitting device is coupled to the pixel driving circuit through the via hole penetrating the pixel definition layer;
    a light emitting functional layer of the third light emitting device comprises a hole transport layer, a light emitting material layer and an electron transport layer that are stacked in sequence, the hole transport layer is located on a side of a first electrode layer of the third light emitting device away from the driving backplane, and an orthographic projection of the second electrode layer of the second light emitting device on the driving backplane is covered by an orthographic projection of the hole transport layer on the driving backplane; the light emitting material layer is located on a side of the hole transport layer away from the driving backplane, and an orthographic projection of the light emitting material layer in the opening and the orthographic projection of the second electrode layer of the second light emitting device in the opening are at least partially overlapped; and a surface of a structure jointly formed by the light emitting material layer and the hole transport layer is covered by the electron transport layer; and
    a second electrode layer of the third light emitting device is located on a side of the electron transport layer away from the driving backplane, and an orthographic projection of the second electrode layer of the third light emitting device in the opening and the orthographic projection of the light emitting material layer in the opening are at least partially overlapped.

2. The display panel according to claim 1, wherein each light emitting device comprises:
    the first electrode layer, formed on a side of the driving backplane and coupled to one of the pixel driving circuits;
    the light emitting functional layer, formed on a surface of the first electrode layer away from the driving backplane; and the second electrode layer, formed on a surface of the light emitting functional layer away from the driving backplane;

wherein among two adjacent light emitting devices in the direction perpendicular to the driving backplane, the second electrode layer of a light emitting device closer to the driving backplane and the first electrode layer of a light emitting device away from the driving backplane are the same electrode layer.

3. The display panel according to claim 2, wherein light emitting materials of the first light emitting device, the second light emitting device and the third light emitting device are different from each other for emitting light of different colors.

4. The display panel according to claim 3, wherein a light emitting color of the first light emitting device is blue, a light emitting color of the second light emitting device is green, and a light emitting color of the third light emitting device is red.

5. The display panel according to claim 3, wherein the driving backplane further comprises connecting leads, the connecting leads comprise a first lead and a second lead spaced apart from the first electrode layer, and the first lead and the second lead are respectively coupled to different pixel driving circuits;

the pixel definition layer further comprises:
a first pixel definition layer, disposed on the same side of the driving backplane as the first electrode layer of the first light emitting device, wherein the first pixel definition layer is provided with multiple first openings exposing the first electrode layer of each first light emitting device, and a sidewall of each first opening is shrunk along the direction away from the driving backplane; and
a second pixel definition layer, disposed on the same side of the driving backplane as the first pixel definition layer, located within the first opening, and having a first gap with the sidewall of the first opening, wherein the second lead is at least partially exposed in the first gap, the second pixel definition layer comprises a second opening, and the first electrode layer of the first light emitting device is located within the second opening and has a second gap with a sidewall of the second opening, the first lead is at least partially exposed in the second gap; a thickness of the second pixel definition layer is smaller than that of the first pixel definition layer in the direction perpendicular to the driving backplane;
the light emitting functional layer of the first light emitting device is at least partially disposed in the second opening, and is disconnected at a boundary of the second opening;
the second electrode layer of the first light emitting device is at least partially disposed in the second opening, the first lead is at least partially covered by the second electrode layer of the first light emitting device, and the second electrode layer of the first light emitting device is disconnected at the boundary of the second opening;
a surface of the second electrode layer of the first light emitting device away from the driving backplane is covered by the light emitting functional layer of the second light emitting device, and the light emitting functional layer of the second light emitting device is continuous in the second opening and is disconnected at a boundary of the first opening; the second lead is exposed by the light emitting functional layer of the second light emitting device;

a surface of the light emitting functional layer of the second light emitting device is at least partially covered by the second electrode layer of the second light emitting device, and the second lead is at least partially covered by the second electrode layer of the second light emitting device; the second electrode layer of the second light emitting device is disconnected at the boundary of the first opening, and an orthographic projection of the second electrode layer of the second light emitting device on the driving backplane is at least partially overlapped with an orthographic projection of the light emitting functional layer of the first light emitting device on the driving backplane;

the light emitting functional layer of the third light emitting device is located on a side of the first electrode layer of the third light emitting device away from the driving backplane, and an orthographic projection of the first electrode layer of the third light emitting device on the driving backplane is covered by an orthographic projection of the light emitting functional layer of the third light emitting device on the driving backplane; and a surface of the light emitting functional layer of the third light emitting device away from the driving backplane is covered by the second electrode layer of the third light emitting device, and the orthographic projection of the light emitting functional layer of the third light emitting device on the driving backplane is covered by an orthographic projection of the second electrode layer of the third light emitting device on the driving backplane.

6. The display panel according to claim 3, wherein the driving backplane further comprises connecting leads, the connecting leads comprise a first lead and a second lead spaced apart from the first electrode layer, and the first lead and the second lead are respectively coupled to different pixel driving circuits;

the pixel definition layer further comprises:
a first pixel definition layer, disposed on the same side of the driving backplane as the first electrode layer of the first light emitting device, wherein the first pixel definition layer is provided with multiple first openings exposing the first electrode layer of each first light emitting device and at least partially exposing the first lead, a sidewall of each first opening is shrunk along the direction away from the driving backplane, and the second lead penetrates the first pixel definition layer and is exposed on a top surface of the first pixel definition layer;
a second pixel definition layer, disposed on a surface of the first pixel definition layer away from the driving backplane and having multiple second openings exposing each first opening and at least partially exposing the second lead, wherein a sidewall of the second opening is shrunk along the direction away from the driving backplane;
the light emitting functional layer of the first light emitting device is at least partially disposed in the first opening, and is disconnected at a boundary of the first opening or the second opening;
the second electrode layer of the first light emitting device is at least partially disposed in the first opening, and the first lead is at least partially covered by the second electrode layer of the first light emitting device; and the second electrode layer of the first light emitting device is disconnected at the boundary of the second opening;

a surface of the second electrode layer of the first light emitting device away from the driving backplane is covered by the light emitting functional layer of the second light emitting device, and the light emitting functional layer of the second light emitting device is at least partially located within the first opening and is disconnected at the boundary of the second opening;

a surface of the light emitting functional layer of the second light emitting device is at least partially covered by the second electrode layer of the second light emitting device, and the second lead is at least partially covered by the second electrode layer of the second light emitting device; the second electrode layer of the second light emitting device is disconnected at the boundary of the second opening, and an orthographic projection of the second electrode layer of the second light emitting device on the driving backplane is at least partially overlapped with an orthographic projection of the light emitting functional layer of the first light emitting device on the driving backplane;

the light emitting functional layer of the third light emitting device is located on a side of the first electrode layer of the third light emitting device away from the driving backplane, and an orthographic projection of the first electrode layer of the third light emitting device on the driving backplane is covered by an orthographic projection of the light emitting functional layer of the third light emitting device on the driving backplane; and a surface of the light emitting functional layer of the third light emitting device away from the driving backplane is covered by the second electrode layer of the third light emitting device, and the orthographic projection of the light emitting functional layer of the third light emitting device on the driving backplane is covered by an orthographic projection of the second electrode layer of the third light emitting device on the driving backplane.

7. The display panel according to claim 1, wherein third light emitting devices of individual light emitting units share the hole transport layer and the electron transport layer.

8. The display panel according to claim 1, wherein the display panel further comprises:
a light shielding layer, disposed on a side of the light emitting device layer away from the driving backplane, and having multiple light transmitting holes, wherein individual light transmitting holes are disposed in a one-to-one correspondence with individual openings, and an orthographic projection of each light transmitting hole on the driving backplane and an orthographic projection of a light emitting device in an opening corresponding to the light transmitting hole on the driving backplane are at least partially overlapped.

9. The display panel according to claim 1, wherein the display panel further comprises:
an encapsulation layer, located on a side of the light emitting device layer away from the driving backplane.

10. A display device comprising a display panel, wherein the display panel comprises:
a driving backplane, comprising multiple pixel driving circuits; and
a light emitting device layer, comprising multiple light emitting units distributed in an array, wherein each light emitting unit comprises multiple light emitting devices stacked in a direction away from the driving backplane, and light emitting devices other than a light emitting device closest to the driving backplane in a direction perpendicular to the driving backplane are transparent devices; and wherein in the same light emitting unit, at least part of the light emitting devices are coupled to the pixel driving circuits, to emit light when driven by the pixel driving circuits, and at least two light emitting devices in the same light emitting unit have different light emitting materials, wherein the number of light emitting devices in the same light emitting unit is three, comprising a first light emitting device, a second light emitting device and a third light emitting device distributed in the direction away from the driving backplane, wherein a first electrode layer of the first light emitting device is disposed on the side of the driving backplane, and the display panel further comprises:

a pixel definition layer, disposed on the same side of the driving backplane as the first electrode layer of the first light emitting device, wherein the pixel definition layer is provided with multiple openings exposing the first electrode layer of each first light emitting device; and wherein a light emitting functional layer of the first light emitting device is at least partially disposed in the opening;

a second electrode layer of the first light emitting device is disposed on a surface of the pixel definition layer away from the driving backplane, an orthographic projection of the second electrode layer of the first light emitting device in the opening and an orthographic projection of the light emitting functional layer of the first light emitting device in the opening are at least partially overlapped, and the second electrode layer of the first light emitting device is coupled to the pixel driving circuit through a via hole penetrating the pixel definition layer;

a surface of the second electrode layer of the first light emitting device away from the driving backplane is covered by a light emitting functional layer of the second light emitting device, and an orthographic projection of the second electrode layer of the first light emitting device on the driving backplane is covered by an orthographic projection of the light emitting functional layer of the second light emitting device on the driving backplane;

surfaces of the light emitting functional layer of the second light emitting device and the pixel definition layer are covered by a second electrode layer of the second light emitting device, an orthographic projection of the second electrode layer of the second light emitting device in the opening and the orthographic projection of the light emitting functional layer of the first light emitting device in the opening are at least partially overlapped, and the second electrode layer of the second light emitting device is coupled to the pixel driving circuit through the via hole penetrating the pixel definition layer;

a light emitting functional layer of the third light emitting device comprises a hole transport layer, a light emitting material layer and an electron transport layer that are stacked in sequence, the hole transport layer is located on a side of a first electrode layer of the third light emitting device away from the driving backplane, and an orthographic projection of the second electrode layer of the second light emitting device on the driving backplane is covered by an orthographic projection of the hole transport layer on the driving backplane; the light emitting material layer is located on a side of the hole transport layer away from the driving backplane, and an orthographic projection of the light emitting material layer in the opening and the orthographic projection of the second electrode layer of the second light emitting device in the opening are at least partially overlapped; and a surface of a structure jointly formed by the light emitting material layer and the hole transport layer is covered by the electron transport layer; and a second electrode layer of the third light emitting device is located on a side of the electron transport layer away from the driving backplane, and an orthographic projection of the second electrode layer of the third light emitting device in the opening and the orthographic projection of the light emitting material layer in the opening are at least partially overlapped.

11. The display device according to claim 10, wherein each light emitting device comprises:
the first electrode layer, formed on a side of the driving backplane and coupled to one of the pixel driving circuits;
the light emitting functional layer, formed on a surface of the first electrode layer away from the driving backplane; and
the second electrode layer, formed on a surface of the light emitting functional layer away from the driving backplane;
wherein among two adjacent light emitting devices in the direction perpendicular to the driving backplane, the second electrode layer of a light emitting device closer to the driving backplane and the first electrode layer of a light emitting device away from the driving backplane are the same electrode layer.

12. The display device according to claim 11, wherein light emitting materials of the first light emitting device, the second light emitting device and the third light emitting device are different from each other for emitting light of different colors.

13. The display device according to claim 12, wherein a light emitting color of the first light emitting device is blue, a light emitting color of the second light emitting device is green, and a light emitting color of the third light emitting device is red.

14. The display device according to claim 12, wherein the driving backplane further comprises connecting leads, the connecting leads comprise a first lead and a second lead spaced apart from the first electrode layer, and the first lead and the second lead are respectively coupled to different pixel driving circuits;
the pixel definition layer further comprises:
a first pixel definition layer, disposed on the same side of the driving backplane as the first electrode layer of the first light emitting device, wherein the first pixel definition layer is provided with multiple first openings exposing the first electrode layer of each first light emitting device, and a sidewall of each first opening is shrunk along the direction away from the driving backplane;
a second pixel definition layer, disposed on the same side of the driving backplane as the first pixel definition layer, located within the first opening, and having a first gap with the sidewall of the first opening, wherein the second lead is at least partially exposed in the first gap, the second pixel definition layer comprises a second opening, and the first electrode layer of the first light emitting device is located within the second opening and has a second gap with a sidewall of the second opening, the first lead is at least partially exposed in the second gap; a thickness of the second pixel definition layer is smaller than that of the first pixel definition layer in the direction perpendicular to the driving backplane;

the light emitting functional layer of the first light emitting device is at least partially disposed in the second opening, and is disconnected at a boundary of the second opening;

the second electrode layer of the first light emitting device is at least partially disposed in the second opening, the first lead is at least partially covered by the second electrode layer of the first light emitting device, and the second electrode layer of the first light emitting device is disconnected at the boundary of the second opening;

a surface of the second electrode layer of the first light emitting device away from the driving backplane is covered by the light emitting functional layer of the second light emitting device, and the light emitting functional layer of the second light emitting device is continuous in the second opening and is disconnected at a boundary of the first opening; the second lead is exposed by the light emitting functional layer of the second light emitting device;

a surface of the light emitting functional layer of the second light emitting device is at least partially covered by the second electrode layer of the second light emitting device, and the second lead is at least partially covered by the second electrode layer of the second light emitting device; the second electrode layer of the second light emitting device is disconnected at the boundary of the first opening, and an orthographic projection of the second electrode layer of the second light emitting device on the driving backplane is at least partially overlapped with an orthographic projection of the light emitting functional layer of the first light emitting device on the driving backplane;

the light emitting functional layer of the third light emitting device is located on a side of the first electrode layer of the third light emitting device away from the driving backplane, and an orthographic projection of the first electrode layer of the third light emitting device on the driving backplane is covered by an orthographic projection of the light emitting functional layer of the third light emitting device on the driving backplane; and a surface of the light emitting functional layer of the third light emitting device away from the driving backplane is covered by the second electrode layer of the third light emitting device, and the orthographic projection of the light emitting functional layer of the third light emitting device on the driving backplane is covered by an orthographic projection of the second electrode layer of the third light emitting device on the driving backplane.

15. The display device according to claim 12, wherein the driving backplane further comprises connecting leads, the connecting leads comprise a first lead and a second lead spaced apart from the first electrode layer, and the first lead and the second lead are respectively coupled to different pixel driving circuits;
the pixel definition layer further comprises:
a first pixel definition layer, disposed on the same side of the driving backplane as the first electrode layer of the first light emitting device, wherein the first pixel definition layer is provided with multiple first openings exposing the first electrode layer of each first light emitting device and at least partially exposing the first lead, a sidewall of each first opening is shrunk along the direction away from the driving backplane, and the second lead penetrates the first pixel definition layer and is exposed on a top surface of the first pixel definition layer;

a second pixel definition layer, disposed on a surface of the first pixel definition layer away from the driving backplane and having multiple second openings exposing each first opening and at least partially exposing the second lead, wherein a sidewall of the second opening is shrunk along the direction away from the driving backplane;

the light emitting functional layer of the first light emitting device is at least partially disposed in the first opening, and is disconnected at a boundary of the first opening or the second opening;

the second electrode layer of the first light emitting device is at least partially disposed in the first opening, and the first lead is at least partially covered by the second electrode layer of the first light emitting device; and the second electrode layer of the first light emitting device is disconnected at the boundary of the second opening;

a surface of the second electrode layer of the first light emitting device away from the driving backplane is covered by the light emitting functional layer of the second light emitting device, and the light emitting functional layer of the second light emitting device is at least partially located within the first opening and is disconnected at the boundary of the second opening;

a surface of the light emitting functional layer of the second light emitting device is at least partially covered by the second electrode layer of the second light emitting device, and the second lead is at least partially covered by the second electrode layer of the second light emitting device; the second electrode layer of the second light emitting device is disconnected at the boundary of the second opening, and an orthographic projection of the second electrode layer of the second light emitting device on the driving backplane is at least partially overlapped with an orthographic projection of the light emitting functional layer of the first light emitting device on the driving backplane;

the light emitting functional layer of the third light emitting device is located on a side of the first electrode layer of the third light emitting device away from the driving backplane, and an orthographic projection of the first electrode layer of the third light emitting device on the driving backplane is covered by an orthographic projection of the light emitting functional layer of the third light emitting device on the driving backplane; and a surface of the light emitting functional layer of the third light emitting device away from the driving backplane is covered by the second electrode layer of the third light emitting device, and the orthographic projection of the light emitting functional layer of the third light emitting device on the driving backplane is covered by an orthographic projection of the second electrode layer of the third light emitting device on the driving backplane.

16. The display device according to claim 10, wherein third light emitting devices of individual light emitting units share the hole transport layer and the electron transport layer.

17. The display device according to claim 10, wherein the display panel further comprises:

a light shielding layer, disposed on a side of the light emitting device layer away from the driving backplane, and having multiple light transmitting holes, wherein individual light transmitting holes are disposed in a one-to-one correspondence with individual openings, and an orthographic projection of each light transmitting hole on the driving backplane and an orthographic projection of a light emitting device in an opening corresponding to the light transmitting hole on the driving backplane are at least partially overlapped.

18. A manufacturing method for a display panel, comprising:

forming a driving backplane comprising multiple pixel driving circuits; and forming a light emitting device layer on a side of the driving backplane, wherein the light emitting device layer comprises multiple light emitting units distributed in an array, the light emitting unit comprises multiple light emitting devices stacked in a direction away from the driving backplane, and light emitting devices other than a light emitting device closest to the driving backplane in a direction perpendicular to the driving backplane are transparent devices;

wherein in the same light emitting unit, at least part of the light emitting devices are coupled to the pixel driving circuits, to emit light when driven by the pixel driving circuits, and at least two light emitting devices in the same light emitting unit have different light emitting materials, wherein the number of light emitting devices in the same light emitting unit is three, comprising a first light emitting device, a second light emitting device and a third light emitting device distributed in the direction away from the driving backplane, wherein a first electrode layer of the first light emitting device is disposed on the side of the driving backplane, and the manufacturing method further comprises:

forming a pixel definition layer on the same side of the driving backplane as the first electrode layer of the first light emitting device, wherein the pixel definition layer is provided with multiple openings exposing the first electrode layer of each first light emitting device; and wherein a light emitting functional layer of the first light emitting device is at least partially disposed in the opening;

a second electrode layer of the first light emitting device is disposed on a surface of the pixel definition layer away from the driving backplane, an orthographic projection of the second electrode layer of the first light emitting device in the opening and an orthographic projection of the light emitting functional layer of the first light emitting device in the opening are at least partially overlapped, and the second electrode layer of the first light emitting device is coupled to the pixel driving circuit through a via hole penetrating the pixel definition layer;

a surface of the second electrode layer of the first light emitting device away from the driving backplane is covered by a light emitting functional layer of the second light emitting device, and an orthographic projection of the second electrode layer of the first light emitting device on the driving backplane is covered by an orthographic projection of the light emitting functional layer of the second light emitting device on the driving backplane;

surfaces of the light emitting functional layer of the second light emitting device and the pixel definition layer are covered by a second electrode layer of the second light emitting device, an orthographic projection of the second electrode layer of the second light emitting device in the opening and the orthographic projection of the light emitting functional layer of the first light emitting device in the opening are at least partially overlapped, and the second electrode layer of the second light emitting device is coupled to the pixel driving circuit through the via hole penetrating the pixel definition layer;

a light emitting functional layer of the third light emitting device comprises a hole transport layer, a light emitting material layer and an electron transport layer that are stacked in sequence, the hole transport layer is located on a side of a first electrode layer of the third light emitting device away from the driving backplane, and an orthographic projection of the second electrode layer of the second light emitting device on the driving backplane is covered by an orthographic projection of the hole transport layer on the driving backplane; the light emitting material layer is located on a side of the hole transport layer away from the driving backplane, and an orthographic projection of the light emitting material layer in the opening and the orthographic projection of the second electrode layer of the second light emitting device in the opening are at least partially overlapped; and a surface of a structure jointly formed by the light emitting material layer and the hole transport layer is covered by the electron transport layer; and a second electrode layer of the third light emitting device is located on a side of the electron transport layer away from the driving backplane, and an orthographic projection of the second electrode layer of the third light emitting device in the opening and the orthographic projection of the light emitting material layer in the opening are at least partially overlapped.

* * * * *